(12) United States Patent
Tang

(10) Patent No.: US 8,598,621 B2
(45) Date of Patent: Dec. 3, 2013

(54) MEMORY CELLS, MEMORY ARRAYS, METHODS OF FORMING MEMORY CELLS, AND METHODS OF FORMING A SHARED DOPED SEMICONDUCTOR REGION OF A VERTICALLY ORIENTED THYRISTOR AND A VERTICALLY ORIENTED ACCESS TRANSISTOR

(75) Inventor: Sanh D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 93 days.

(21) Appl. No.: 13/025,591

(22) Filed: Feb. 11, 2011

(65) Prior Publication Data
US 2012/0205713 A1    Aug. 16, 2012

(51) Int. Cl.
*H01L 29/66* (2006.01)

(52) U.S. Cl.
USPC .... 257/135; 257/115; 257/471; 257/E27.052; 257/E27.079; 257/E29.211; 257/E29.224; 257/E29.037

(58) Field of Classification Search
USPC ................ 257/115, 135, 471, E29.211, 224, 257/36–38, 125
See application file for complete search history.

(56) References Cited

U.S. PATENT DOCUMENTS

| | | | |
|---|---|---|---|
| 5,102,821 A | 4/1992 | Moslehi | |
| 5,260,233 A | 11/1993 | Buti et al. | |
| 5,563,084 A | 10/1996 | Ramm et al. | |
| 5,904,507 A | 5/1999 | Thomas | |
| 5,909,618 A | 6/1999 | Forbes et al. | |
| 6,137,128 A | 10/2000 | Holmes et al. | |
| 6,191,476 B1 | 2/2001 | Takahashi et al. | |
| 6,229,161 B1 | 5/2001 | Nemati et al. | |
| 6,255,731 B1 | 7/2001 | Ohmi et al. | |
| 6,303,468 B1 | 10/2001 | Aspar et al. | |
| 6,335,258 B1 | 1/2002 | Aspar et al. | |
| 6,355,501 B1 | 3/2002 | Fung et al. | |
| 6,355,520 B1 | 3/2002 | Park et al. | |
| 6,365,488 B1 | 4/2002 | Liao | |
| 6,492,662 B2 | 12/2002 | Hsu et al. | |
| 6,559,471 B2 | 5/2003 | Finder et al. | |
| 6,600,173 B2 | 7/2003 | Tiwari | |
| 6,713,791 B2 | 3/2004 | Hsu et al. | |
| 6,744,094 B2 | 6/2004 | Forbes | |

(Continued)

FOREIGN PATENT DOCUMENTS

| | | |
|---|---|---|
| JP | 06-10446 | 4/1994 |
| JP | 2003-030980 | 1/2003 |

(Continued)

OTHER PUBLICATIONS

U.S. Appl. No. 12/410,207, filed Mar. 24, 2009, Tang et al.

(Continued)

*Primary Examiner* — Minchul Yang
(74) *Attorney, Agent, or Firm* — Wells St. John, P.S.

(57) ABSTRACT

A memory cell includes a thyristor having a plurality of alternately doped, vertically superposed semiconductor regions; a vertically oriented access transistor having an access gate; and a control gate operatively laterally adjacent one of the alternately doped, vertically superposed semiconductor regions. The control gate is spaced laterally of the access gate. Other embodiments are disclosed, including methods of forming memory cells and methods of forming a shared doped semiconductor region of a vertically oriented thyristor and a vertically oriented access transistor.

17 Claims, 19 Drawing Sheets

(56) References Cited

U.S. PATENT DOCUMENTS

| | | |
|---|---|---|
| 6,756,286 B1 | 6/2004 | Moriceau et al. |
| 6,809,044 B1 | 10/2004 | Aspar et al. |
| 6,888,199 B2 | 5/2005 | Nowak et al. |
| 6,906,354 B2 | 6/2005 | Hsu et al. |
| 6,946,365 B2 | 9/2005 | Aspar et al. |
| 6,953,953 B1 | 10/2005 | Horch |
| 6,995,456 B2 | 2/2006 | Nowak |
| 7,029,956 B2 | 4/2006 | Hsu et al. |
| 7,052,941 B2 | 5/2006 | Lee |
| 7,075,146 B2 | 7/2006 | Forbes |
| 7,115,939 B2 | 10/2006 | Forbes |
| 7,120,046 B1 | 10/2006 | Forbes |
| 7,157,771 B2 | 1/2007 | Forbes |
| RE39,484 E | 2/2007 | Bruel |
| 7,268,373 B1 | 9/2007 | Gupta et al. |
| 7,271,052 B1 | 9/2007 | Forbes |
| 7,279,740 B2 | 10/2007 | Bhattacharyya et al. |
| 7,323,380 B2 | 1/2008 | Forbes |
| 7,326,969 B1 | 2/2008 | Horch |
| 7,358,120 B2 | 4/2008 | Ferukawa et al. |
| 7,359,229 B2 | 4/2008 | Ferrant et al. |
| 7,368,352 B2 | 5/2008 | Kim et al. |
| 7,410,867 B2 | 8/2008 | Forbes |
| 7,415,690 B2 | 8/2008 | Liang et al. |
| 7,440,310 B2 | 10/2008 | Bhattacharyya |
| 7,456,439 B1 | 11/2008 | Horch |
| 7,476,939 B2 | 1/2009 | Okhonin et al. |
| 7,488,627 B1 | 2/2009 | Nemati et al. |
| 7,491,608 B2 | 2/2009 | Forbes |
| 7,518,182 B2 | 4/2009 | Abbott et al. |
| 7,538,000 B2 | 5/2009 | Dao |
| 7,579,240 B2 | 8/2009 | Forbes |
| 7,589,995 B2 | 9/2009 | Tang et al. |
| 7,592,209 B2 | 9/2009 | Chang |
| 7,619,917 B2 | 11/2009 | Nirschi et al. |
| 7,838,360 B2 | 11/2010 | Forbes |
| 2001/0002062 A1 | 5/2001 | Noble, Jr. et al. |
| 2001/0024841 A1 | 9/2001 | Noble, Jr. et al. |
| 2002/0070454 A1 | 6/2002 | Yasukawa |
| 2002/0158254 A1* | 10/2002 | Hsu et al. .................. 257/77 |
| 2002/0163019 A1 | 11/2002 | Mohsen |
| 2004/0159853 A1 | 8/2004 | Nemati et al. |
| 2004/0214379 A1 | 10/2004 | Lee et al. |
| 2005/0001232 A1 | 1/2005 | Bhattacharyya |
| 2005/0230356 A1 | 10/2005 | Empedocles et al. |
| 2006/0034116 A1 | 2/2006 | Lam et al. |
| 2006/0071074 A1 | 4/2006 | Konevecki et al. |
| 2006/0099776 A1 | 5/2006 | Dupont |
| 2006/0125011 A1 | 6/2006 | Chang |
| 2006/0197115 A1 | 9/2006 | Toda |
| 2006/0227601 A1 | 10/2006 | Bhattacharyya |
| 2007/0023805 A1 | 2/2007 | Wells et al. |
| 2007/0045709 A1 | 3/2007 | Yang |
| 2007/0215954 A1 | 9/2007 | Mouli |
| 2007/0252175 A1 | 11/2007 | Tang et al. |
| 2007/0264771 A1 | 11/2007 | Ananthan |
| 2008/0124867 A1 | 5/2008 | Brown |
| 2008/0128802 A1 | 6/2008 | Huo et al. |
| 2008/0211023 A1 | 9/2008 | Shino |
| 2008/0233694 A1 | 9/2008 | Li |
| 2008/0237776 A1 | 10/2008 | Abbott |
| 2008/0299753 A1 | 12/2008 | Figura et al. |
| 2009/0003025 A1 | 1/2009 | Mokhlesi et al. |
| 2009/0010056 A1 | 1/2009 | Kuo et al. |
| 2009/0014813 A1 | 1/2009 | Chao et al. |
| 2009/0022003 A1 | 1/2009 | Song et al. |
| 2009/0026522 A1 | 1/2009 | Ananthan |
| 2009/0072341 A1 | 3/2009 | Liu et al. |
| 2009/0079030 A1 | 3/2009 | Cheng et al. |
| 2009/0108351 A1 | 4/2009 | Yang et al. |
| 2009/0170261 A1 | 7/2009 | Lee |
| 2009/0200536 A1 | 8/2009 | Van Schaijk et al. |
| 2009/0201723 A1 | 8/2009 | Okhonin et al. |
| 2009/0207681 A1 | 8/2009 | Juengling |
| 2009/0213648 A1 | 8/2009 | Slesazeck |
| 2009/0218656 A1 | 9/2009 | Gonzalez et al. |
| 2009/0242865 A1 | 10/2009 | Lung et al. |

FOREIGN PATENT DOCUMENTS

| | | |
|---|---|---|
| KR | 10-2010-0070835 | 6/2010 |
| WO | PCT/US2011/024354 | 9/2011 |
| WO | PCT/US2011/024376 | 9/2011 |
| WO | PCT/US2011/024387 | 9/2011 |
| WO | PCT/US2012/021438 | 8/2012 |
| WO | PCT/US2011/024354 | 9/2012 |
| WO | PCT/US2011/024376 | 9/2012 |
| WO | PCT/US2011/024387 | 9/2012 |

OTHER PUBLICATIONS

U.S. Appl. No. 12/419,658, filed Apr. 7, 2009, Tang et al.
U.S. Appl. No. 12/715,704, filed Apr. 14, 2011, Tang et al.
U.S. Appl. No. 12/715,743, filed Mar. 2, 2010, Tang et al.
U.S. Appl. No. 12/715,889, filed Mar. 2, 2010, Tang et al.
Cho et al., "A Novel Capacitor-Less DRAM Cell Using Thin Capacitively-Coupled Thyristor (TCCT)", IEEE, 2005, 4 pages.
Nemati et al., "A Novel High Density Low Voltage SRAM Cell with a Vertical NDR Device", IEEE, 1998, 2 pages.
Sasago et al., "Cross-point phase change memory with 4F2 cell size driven by low-contact-resistivity poly-Si dioxide", 2009 Symposium on VLSI Technology Digest of Technical Papers, pp. 24-25.
Sugizaki et al., "35-nm Gate-Length and Ultra Low-voltage (0.45 V) Operation Bulk Thyristor-SRAM/DRAM (BT-RAM) Cell with Triple Selective Epitaxy Layers (TELs)", 2008 Symposium on VLSI Technology Digest of Techical Papers.
Suliman et al., "Gate-Oxide Grown on the Sldewalls and Base of a U-Shaped Si Trench: Effects of the Oxide and Oxide/Si Interface Condition on the Properties of Vertical MOS Devices", Microelectronic Engineering, 2004, vol. 72, pp. 247-252.
Yang et al., "High Performance CMOS Fabricated on Hybrid Substrate with Different Crystal Orientations", IEEE, 2003, 4 pages.
Yu et al., "Low-Temperature Titanium-Based Wafer Bonding", Journal of the Electrochemical Society, vol. 154(1), 2007, pp. H20-H25.
U.S. Appl. No. 12/715,843, filed Mar. 2, 2010, Tang et al.
U.S. Appl. No. 12/715,922, filed Mar. 2, 2010, Tang et al.

* cited by examiner

US 8,598,621 B2

MEMORY CELLS, MEMORY ARRAYS, METHODS OF FORMING MEMORY CELLS, AND METHODS OF FORMING A SHARED DOPED SEMICONDUCTOR REGION OF A VERTICALLY ORIENTED THYRISTOR AND A VERTICALLY ORIENTED ACCESS TRANSISTOR

TECHNICAL FIELD

Embodiments disclosed herein pertain to memory cells, to memory arrays, to methods of forming memory cells, and to methods of forming a shared doped semiconductor region of a vertically oriented thyristor and a vertically oriented access transistor.

BACKGROUND

Many integrated circuit (IC) memory devices conventionally include static random access memory (SRAM). Conventional SRAM is based on four-transistor memory cells (4T SRAM cells) or six-transistor memory cells (6T SRAM cells) that are compatible with conventional memory elements, such as complementary metal-oxide-semiconductor (CMOS) devices, operate at low voltage levels, and perform at relatively high speeds. However, conventional SRAM consumes a large cell area that limits high-density design of SRAM.

In attempts to reduce the area of IC memory devices, high-density, low-voltage SRAM cells including four layers of alternating n- and p-type semiconductive material, often referred to as a "thin capacitively-coupled thyristor (TCCT)" have been fabricated. As used herein, the term "thyristor," means and includes a bi-stable, three-terminal device that includes a four layer structure including a p-type anode region, an n-type base, a p-type base, and an n-type cathode region arranged in a p-n-p-n configuration. The thyristor may include two main terminals, an anode and a cathode. Further, a control terminal, often referred to as the "gate," may be operatively adjacent to the p-type material nearest the cathode. Thyristor-based random access memory (T-RAM) cells demonstrate faster switching speeds and lower operating voltages in comparison to conventional SRAM cells.

A thyristor in a memory device may be turned on by biasing the gate so that a p-n-p-n channel conducts a current. Once the device is turned on, often referred to as "latched," the thyristor does not require the gate to be biased to maintain the current conducted between the cathode and the anode. Instead, it will continue to conduct until a minimum holding current is no longer maintained between the anode and cathode, or until the voltage between the anode and the cathode is reversed. Accordingly, the thyristor may function as a switch or diode capable of being switched between an "on" state and an "off" state.

DETAILED DESCRIPTION OF EXAMPLE EMBODIMENTS

Figure 1:
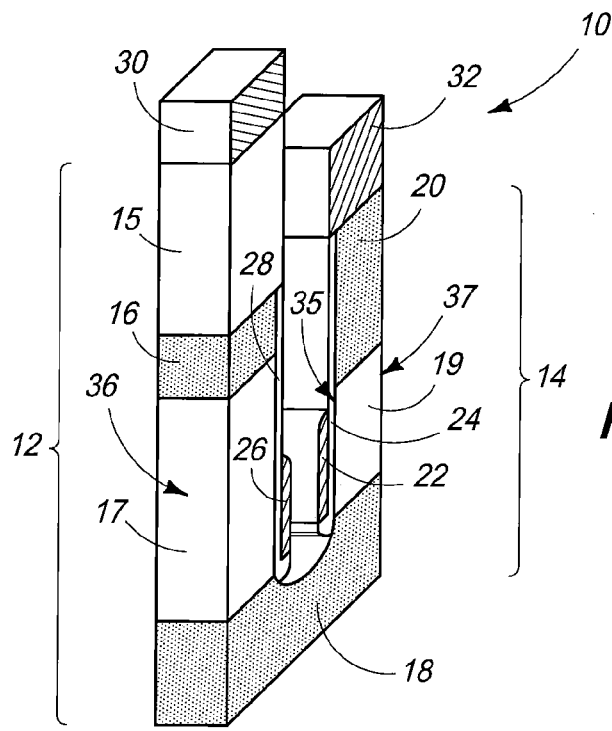
FIG. 1 is a diagrammatic oblique projection view of a memory cell in accordance with an embodiment of the invention.
Figure 2:
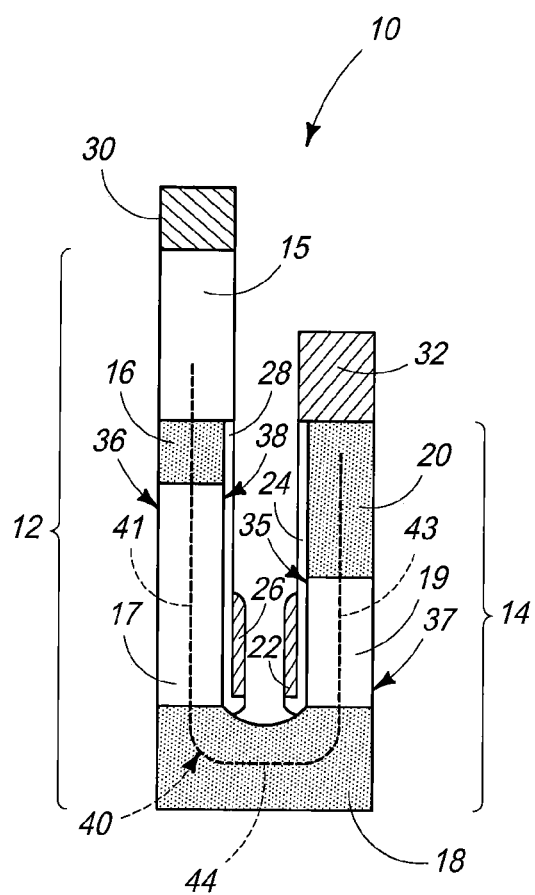
FIG. 2 is a side elevational view of the memory cell of FIG. 1.

Some example embodiments of memory cells in accordance with the invention are initially described with respect to a memory cell 10 in FIGS. 1 and 2. In one embodiment, such comprises at least one thyristor 12 and at least one vertically oriented access transistor 14.

Memory cell 10 may be fabricated relative to a suitable base substrate (not shown) which may be homogenous or non-homogenous, for example comprising multiple different composition materials and/or layers. As an example, such may comprise bulk monocrystalline silicon and/or a semiconductor-on-insulator substrate. As an additional example, such may comprise dielectric material having conductive contacts or vias formed therein which extend vertically or otherwise into current conductive electrical connection with electronic device components, regions, or material received elevationally inward of the dielectric material. In this document, vertical is a direction generally orthogonal to a primary surface relative to which a substrate is processed during fabrication and which may be considered to define a generally horizontal direction. Further, "vertical" and "horizontal" as used herein are generally perpendicular directions relative one another independent of orientation of the substrate in three dimensional space. Further in this document, "elevational" and "elevationally" are with reference to the vertical direction from the base substrate upon which the circuitry is fabricated.

The base substrate may or may not be a semiconductor substrate. In this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Thyristor 12 may comprise a plurality of alternately doped, vertically superposed semiconductor regions 15, 16, 17, and 18. Vertically oriented access transistor 14 may comprise a plurality of alternately doped, superposed semiconductor regions 18, 19, and 20. Accordingly in some embodiments, thyristor 12 and access transistor 14 share one of the alternately doped, superposed semiconductor regions, for example region 18 in FIGS. 1 and 2. As used herein, the term "vertically superposed" means and includes materials or regions which are disposed elevationally atop or situated one upon another. Lateral perimeters thereof might generally coincide. Further, "alternately doped" means and includes with respect to the stated regions opposite n and p conductivity type disposed in succession one after the other. Material of respective regions 15-20 may be homogenous or non-homogenous, and may comprise any existing or yet-to-be-developed semiconductor material. Crystalline silicon material, silicon germanium material, gallium arsenide material, and/or gallium nitride material are some examples.

Semiconductor regions 15, 18, and 20 may be "highly doped" to the same or different respective n or p dopant concentration(s). Semiconductor regions 16, 17, and 19 may not be highly doped, and may be of the same or different dopant concentration(s). As used herein, the term "highly doped" means and includes a material or region having a higher concentration of a dopant than those which are not highly doped. With respect to thyristor 12, region 15 may be a p-type anode region, region 16 an n-type base region, region 17 a p-type base region, and region 18 an n-type cathode region.

In one embodiment, access transistor 14 has an access gate 22 which is operatively laterally adjacent an unshared of the semiconductor regions of the access transistor, for example region 19 as shown. A suitable gate dielectric 24 is received between at least access gate 22 and region 19, with such also in the example embodiment extending over a portion of shared region 18 and laterally over semiconductor region 20. A control gate 26 is spaced laterally of access gate 22, and is operatively laterally adjacent one of the alternately doped, vertically superposed semiconductor regions, for example unshared region 17 as shown. A suitable gate dielectric 28 is received between at least control gate 26 and semiconductor region 17, with gate dielectric 28 in the example embodiment extending over shared semiconductor region 18 and laterally over semiconductor region 16. Gate dielectrics 24 and 28 may be homogenous or non-homogenous, and of the same or different composition(s). Gates 22 and 26 comprise current conductive material, and may be homogenous or non-homogenous. In this document, "current conductive material" is a composition where electric current flow would inherently occur therein predominantly by movement by subatomic positive and/or negative charges when such are generated as opposed to predominantly by movement of ions. Example current conductive materials are elemental metals, alloys of elemental metals, current conductive metal compounds, and conductively doped semiconductive material, including any combination thereof.

In one embodiment, the access gate and the control gate elevationally overlap, and in one embodiment, are elevationally coincident. In this document, constructions "elevationally overlap" if some respective portions thereof are elevationally at the same level. Elevationally overlapping constructions are "elevationally coincident" if their elevationally outermost and innermost extents/surfaces are elevationally at the same level.

An electrode 30 may be in current conductive connection with semiconductor region 15, and an electrode 32 may be in current conductive connection with semiconductor region 20. Each may comprise current conductive material, and may be homogenous or non-homogenous.

In one embodiment of the invention, a memory cell comprises a vertically oriented thyristor and a control gate operatively laterally adjacent thereto. Such also includes a vertically oriented access transistor laterally spaced from the vertically oriented thyristor and which shares a doped semiconductor region therewith that extends laterally between the vertically oriented thyristor and the vertically oriented access transistor. That which is depicted in FIGS. 1 and 2 is but one such example embodiment.

Figure 3:
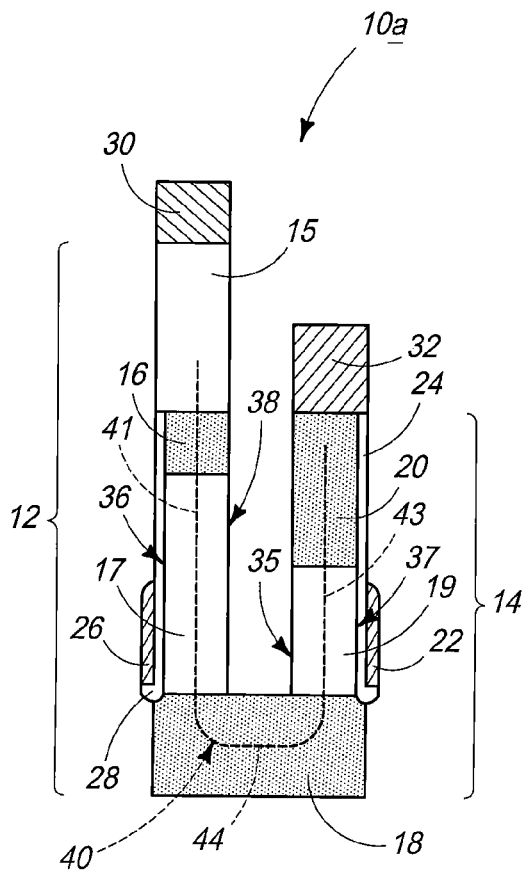
FIG. 3 is a side elevational view of a memory cell in accordance with an embodiment of the invention.

In one embodiment, a vertically oriented access transistor comprises a channel region having a pair of laterally opposing sides, with the access gate being operatively laterally adjacent only one of such sides. Memory cell 10 is an example such memory cell wherein semiconductor region 19 comprises a channel region having a pair of laterally opposing sides 35 and 37, with access gate 22 being operatively laterally adjacent only the one side 35. FIG. 3 depicts an alternate example embodiment memory cell 10a wherein access gate 22 and gate dielectric 24 are received operatively laterally adjacent only the one side 37 of semiconductor region 19.

In one embodiment, the one of the alternately doped, vertically superposed semiconductor regions which the control gate is operatively laterally adjacent has a pair of laterally opposing sides, with the control gate only being so adjacent one of such sides. For example with respect to memory cell 10 in FIG. 2, semiconductor region 17 has a pair of laterally opposing sides 36 and 38, with control gate 26 being operatively laterally adjacent only the side 38. FIG. 3 depicts an alternate example embodiment wherein control gate 26 is adjacent only the one side 36. FIGS. 1-3 depict but two example embodiments wherein gates 22 and 26 are only on one respective side of a channel region. Of course, access gate 22 may alternately be over side 35 in FIG. 3 (not shown), or control gate 26 could be over side 38 in FIG. 3 (not shown).

Figure 4:
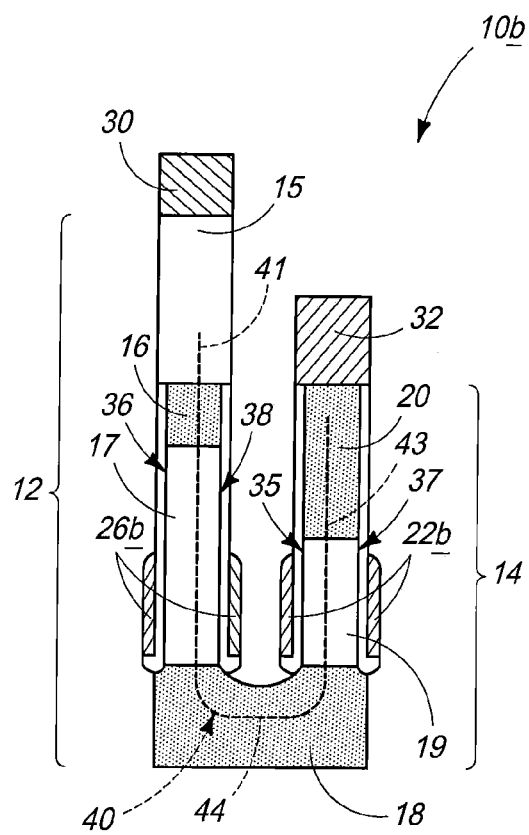
FIG. 4 is a side elevational view of a memory cell in accordance with an embodiment of the invention.

In one embodiment, the access gate may comprise a pair of such gates with one of each being received operatively laterally adjacent one of the pair of laterally opposing sides of the channel region. Additionally or alternately, the control gate may comprise a pair of such gates with one of each being received operatively laterally adjacent one of the pair of laterally opposing sides of one of the vertically superposed, alternately doped semiconductor regions of the thyristor. For example, FIG. 4 depicts such a memory cell 10b. Like numerals from the above-described embodiments have been used where appropriate, with some construction differences being shown with the letter "b". Memory cell 10b includes a pair of access gates 22b and a pair of control gates 26b. In one embodiment, access gates 22b may be hard-wired together. In one embodiment, control gates 26b may be hard-wired together. Regardless, any of the FIGS. 1 and 2 embodiment and the FIG. 3 embodiment may be combined wherein either the access gate or control gate comprises a pair of such gates on opposing lateral sides with the other comprising only a single gate on only one lateral side.

In one embodiment, a memory cell comprises a plurality of alternately doped, superposed semiconductor regions at least an elevationally inner portion of which forms an upwardly directed container shape in lateral cross section. The semiconductor regions collectively comprise serially electrically connectable portions of a thyristor and an access transistor of the memory cell and which share one of the doped semiconductor regions. An access gate is operatively laterally adjacent an unshared of the semiconductor regions of the access transistor. A control gate is operatively laterally adjacent an unshared of the semiconductor regions of the thyristor. By way of example only, any of the embodiments of FIGS. 1-4 as shown and described are such example memory cells.

For example with respect to the depicted memory cells, an elevationally inner upwardly directed container shape in lateral cross section of semiconductor regions 15-20 is indicated generally with reference numeral 40. In one embodiment and as shown, the upwardly directed container shape is in the form of a general U-shape. "V" and/or other upwardly directed container shapes may be used. In one embodiment, the access gate is received laterally within the upwardly directed container shape (i.e., FIGS. 1, 2, and 4), and in one embodiment is not received laterally outside of the upwardly directed container shape (i.e., FIGS. 1 and 2). In one embodiment, the access gate is received laterally outside of the upwardly directed container shape (i.e., FIGS. 3 and 4), and in one embodiment is not received laterally within the upwardly directed container shape (i.e., FIG. 3). In one embodiment, the access gate comprises a pair of access gate portions, one of which is received laterally within the upwardly directed container shape and another of which is received laterally outside the upwardly directed container shape (i.e., FIG. 4). Any one or combination of the just-described lateral orientations with respect to the access gate may additionally or alternately occur with respect to the control gate.

In one embodiment, the container shape as a general U-shape has a pair of vertical stems having a base extending laterally there-between in the lateral cross section, with one of the stems being taller than the other. For example with respect to the embodiments of FIGS. 1-4, U-shape 40 may be considered as having vertical stems 41 and 43 having a base 44 extending laterally there-between. Vertical stem 41 is taller than vertical stem 43. Alternately by way of examples only, the height of the respective stems could be reversed whereby a stem 43 of the access transistor is taller (not shown) than a stem 41 of the thyristor, or such stems may be of equal height/tallness (not shown). Regardless, other attributes as described above may be used.

Embodiments of the invention encompass a memory array comprising a horizontal array of memory cells, with one such example memory array 50 that includes memory cells 10 being shown and described with reference to FIG. 5. Like numerals from FIGS. 1 and 2 have been used in FIG. 5 where appropriate, with some construction differences and additions being indicated with different numerals. Array 50 is received over some suitable base substrate 51, and comprises a plurality of thyristors 12 substantially aligned in a plurality of rows 52 in a first direction "x" and in a plurality of columns 54 in a second direction "y" that angles relative to the first direction "x". In one embodiment as shown, "x" and "y" are perpendicular. Individual of the thyristors comprise a plurality of alternately doped, vertically superposed semiconductor regions, for example regions 15-18.

Array 50 includes a plurality of vertically oriented access transistors 14 substantially aligned in a plurality of rows 56 in first direction "x" and in a plurality of columns 54 in second direction "y". Accordingly in one embodiment, thyristor columns 54 and access transistor columns 54 may be the same. Individual of the access transistors have an access gate which comprises a portion of individual conductive access gate lines 58 oriented in a plurality of rows in first direction "x". A control gate is operatively laterally adjacent one of the plurality of vertically superposed, alternately doped semiconductor regions of individual of the plurality of thyristors 12, for example control gates 26 which are operatively laterally adjacent respective semiconductor regions 17. Individual of the control gates comprise a portion of individual conductive control gate lines 60 oriented in a plurality of rows in first direction "x". In one embodiment, the thyristors are vertically taller than the access transistors. In one embodiment, the access gate lines are spaced laterally of the control gate lines, and in one embodiment alternate one after the other across the horizontal array in second direction "y". In one embodiment, the access gate lines and control gate lines elevationally overlap, and in one embodiment are elevationally coincident. Regardless, the rows, columns, and/or lines therein may be straight linear as shown or curvilinear (not shown).

A plurality of cathode lines 62 are substantially aligned in a plurality of rows in first direction "x" elevationally outward of access gate lines 58 and elevationally outward of control gate lines 60. Cathode lines 62 may be homogenous or non-homogenous, and comprise current conductive material. A plurality of anode lines 64 are substantially aligned in a plurality of columns in second direction "y" elevationally outward of control gate lines 60 and elevationally outward of access gate lines 58. Regardless, lines 62 and/or 64 may be straight linear as shown or curvilinear (not shown).

Figure 5:
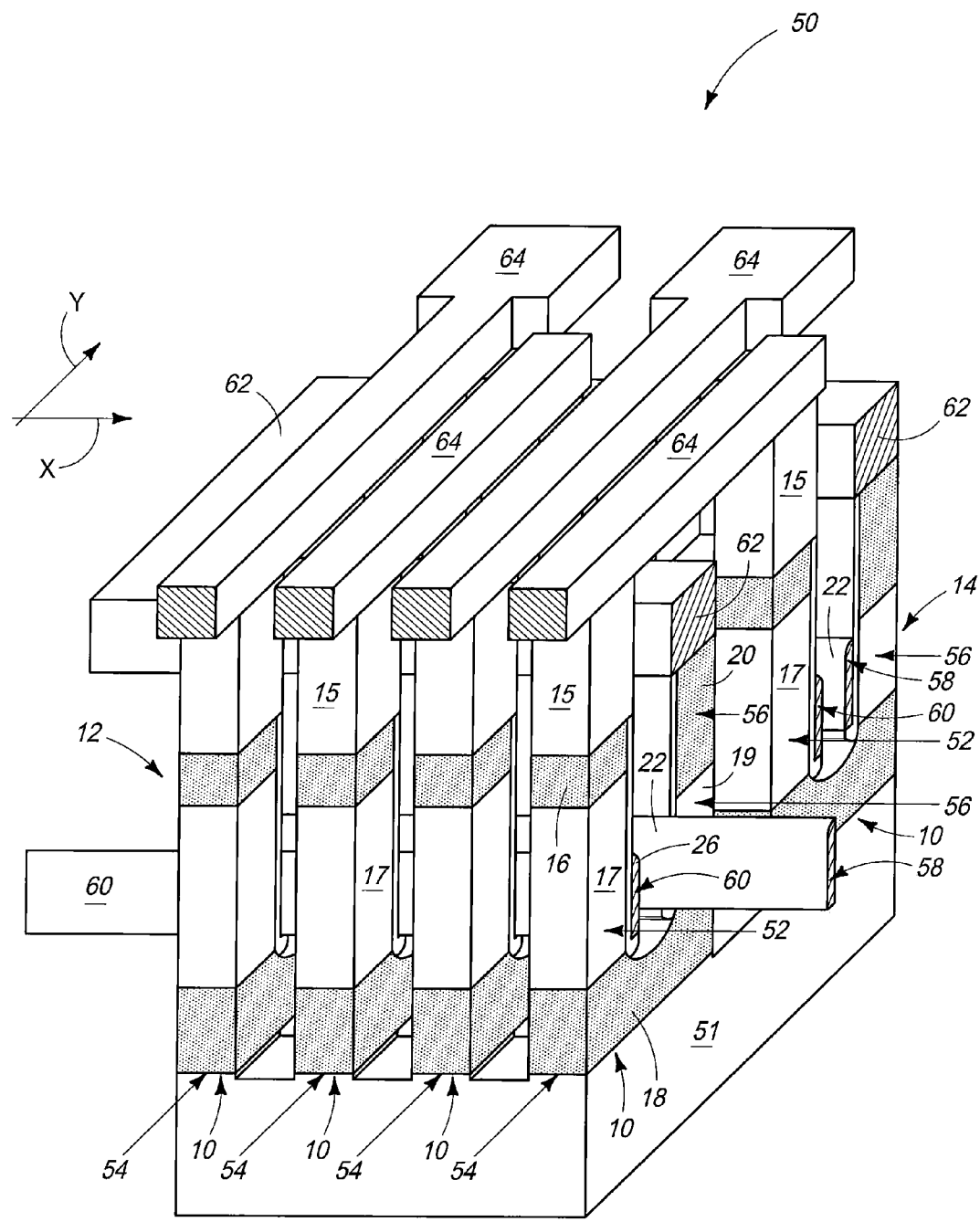
FIG. 5 is a diagrammatic oblique projection view of a portion of a horizontal array of memory cells in accordance with an embodiment of the invention.

FIG. 5 depicts an example embodiment wherein anode lines 64 are elevationally outward of cathode lines 62. Alternately, the cathode lines may be elevationally outward of the anode lines (not shown). In one embodiment, the cathode lines are elevationally outward of the vertically oriented access transistors. In one embodiment, the anode lines are elevationally outward of the thyristors. Any other attribute as described above with respect to the FIGS. 1 and 2, or other embodiments, may be used.

Figure 6:
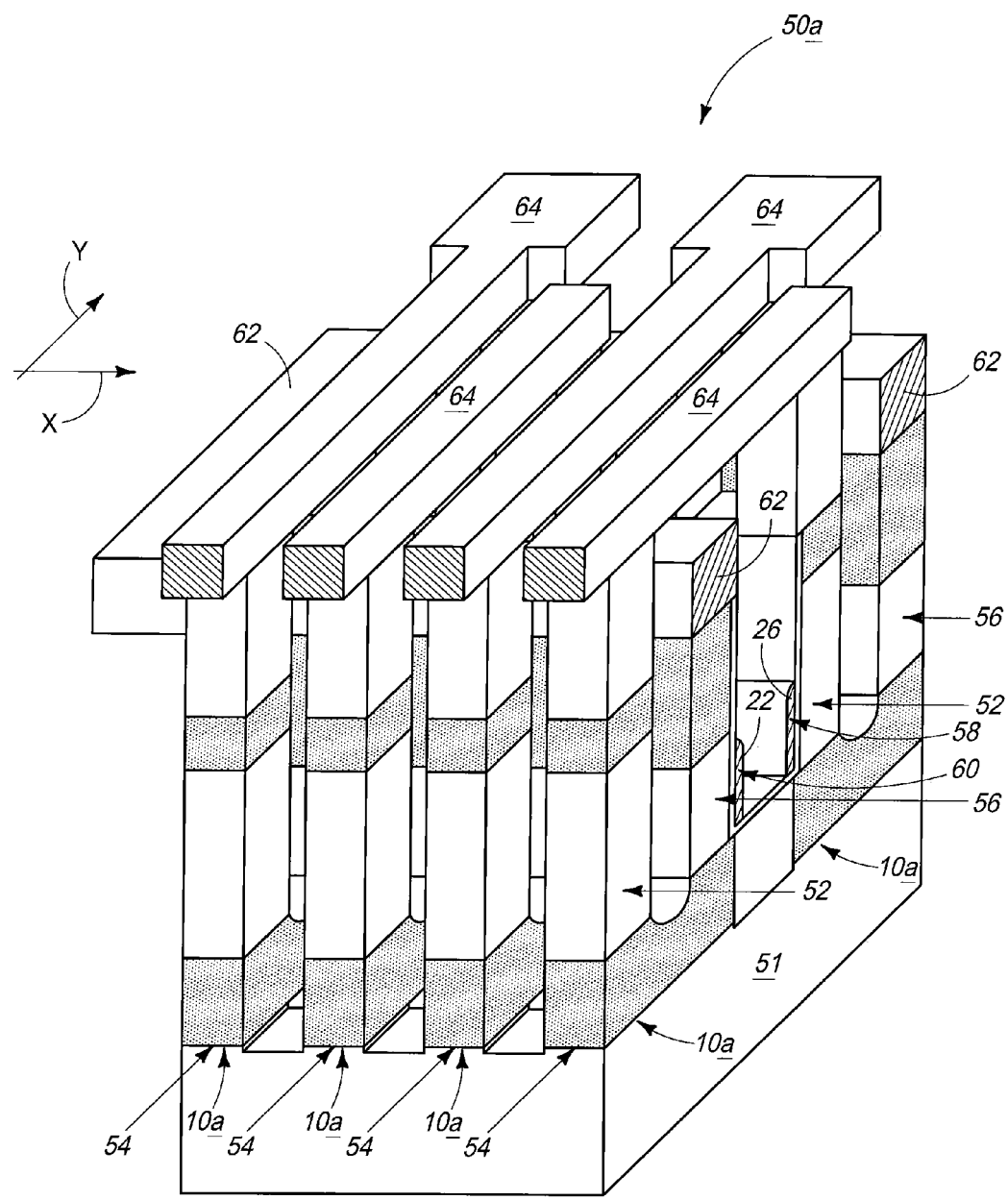
FIG. 6 is a diagrammatic oblique projection view of a portion of another horizontal array of memory cells in accordance with an embodiment of the invention.

FIG. 6 by way of example only, depicts another example memory array 50a comprising a horizontal array of the example memory cells 10a of the FIG. 3 embodiment. Like numerals from the FIGS. 3 and 5 embodiments have been used where appropriate. Any of the above just-described attributes with respect to the memory array embodiment of FIG. 5 may also be used in the FIG. 6 embodiment.

Figure 7:
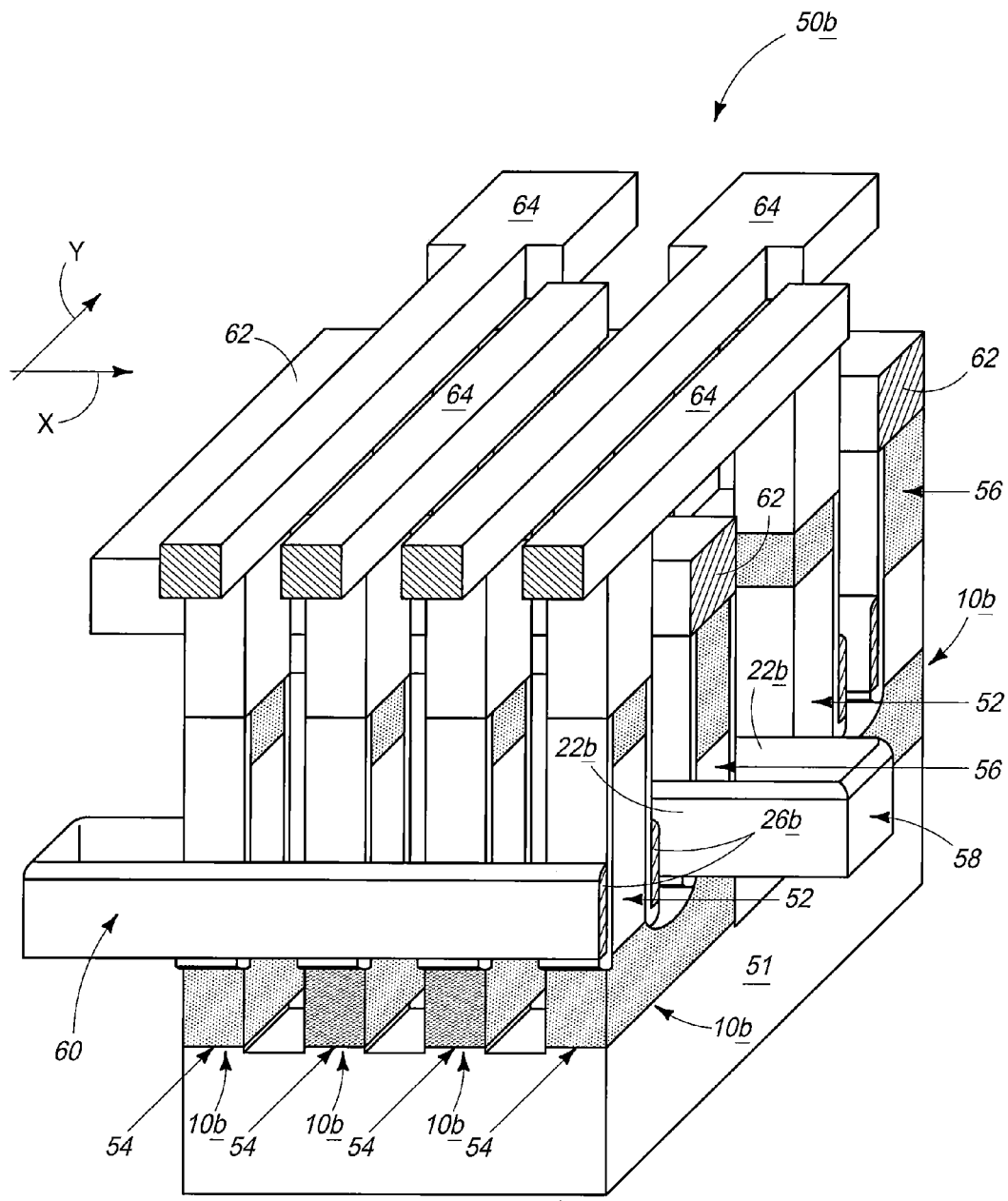
FIG. 7 is a diagrammatic oblique projection view of a portion of another horizontal array of memory cells in accordance with an embodiment of the invention.

FIG. 7 depicts another alternate embodiment memory array 50b incorporating memory cells 10b of FIG. 4. Like numerals from the FIGS. 4 and 5 embodiments have been used where appropriate. As an example, control gate lines 60/26b and access gate lines 58/22b are respectively shown as being hard-wired relative each other. FIG. 7 also depicts an example embodiment wherein access gate lines and control gate lines are spaced laterally apart, with the access gate lines and control gate lines alternating in pairs across the horizontal array in second direction "y". Other attributes as described above with respect to the array embodiments of FIGS. 5 and 6 might additionally or alternatively be used in connection with the FIG. 7 array 50b.

The above embodiments of memory cells and memory arrays may be fabricated by any existing or yet-to-be-developed manner(s). Nevertheless, embodiments of the invention encompass methods of forming one or more memory cells which may or may not encompass some of the structural attributes described above. Accordingly, the method subject matter provided herein is not necessarily limited by the structure subject matter, nor is the structure subject matter as just-described necessarily limited by the method by which such structure(s) may be fabricated.

Figure 8:
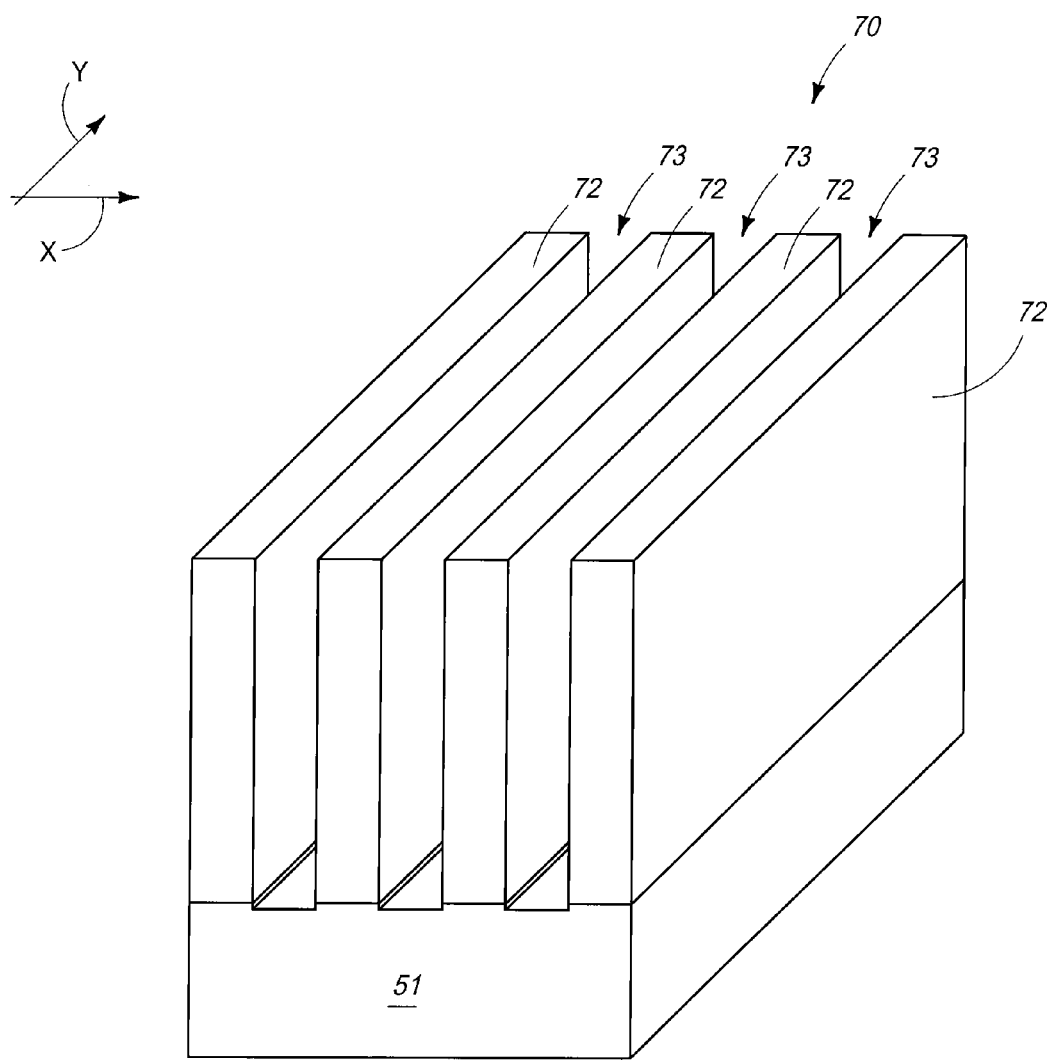
FIG. 8 is a diagrammatic oblique projection view of a substrate fragment in process in accordance with an embodiment of the invention.

An embodiment of the invention encompasses a method of forming a memory cell comprising a vertically oriented thyristor and a control gate operatively laterally adjacent thereto. Such memory cell also comprises a vertically oriented access transistor which shares a doped semiconductor region with the thyristor. One such method is described by way of example only with reference to FIGS. 8-21 with respect to fabricating array 50 of FIG. 5. Accordingly, like numerals from the FIGS. 1, 2 and 5 embodiments have been used where appropriate, with some construction differences or construction precursors being indicated with different numerals. FIG. 8 depicts a substrate fragment 70 comprising, for example, a base 51 having semiconductor material 72 formed thereover. Trenches 73 have been etched through semiconductor material 72, whereby material 72 remains as plates or fins oriented in the "y" direction. Such are shown as being straight rectangular, although other shapes including curved or arcuate shapes might alternately or additionally be used.

Figure 9:
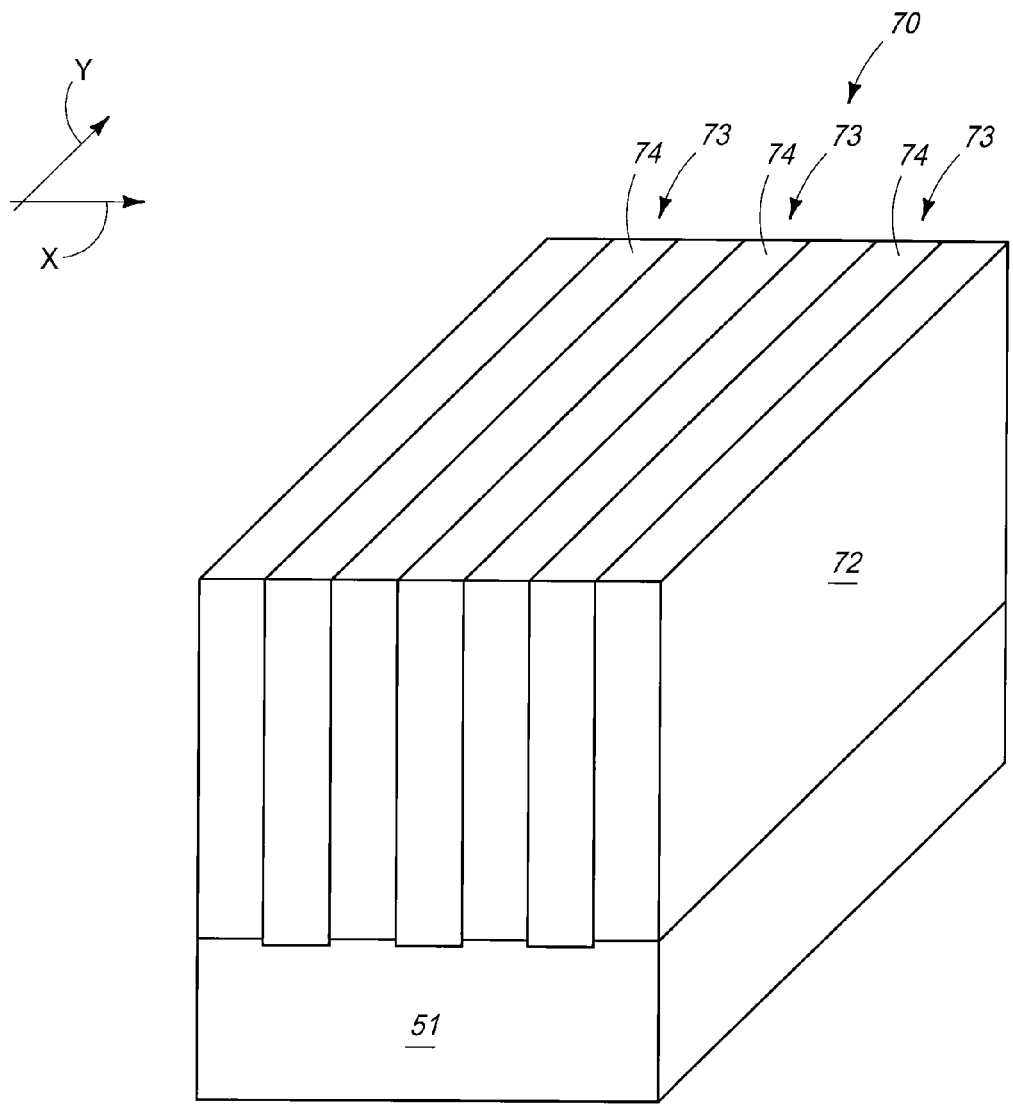
FIG. 9 is a view of the FIG. 8 substrate fragment at a processing step subsequent to that shown by FIG. 8.

Referring to FIG. 9, gaps 73 have been filled with dielectric material 74 which has then been planarized back. Any suitable dielectric material may be used, with doped or undoped silicon dioxide, silicon nitride, etc. being examples. Any masking material (not shown) which may have been used to produce the structure of FIG. 8 may be received over semiconductor material 72 in the structure of FIG. 9.

Figure 10:
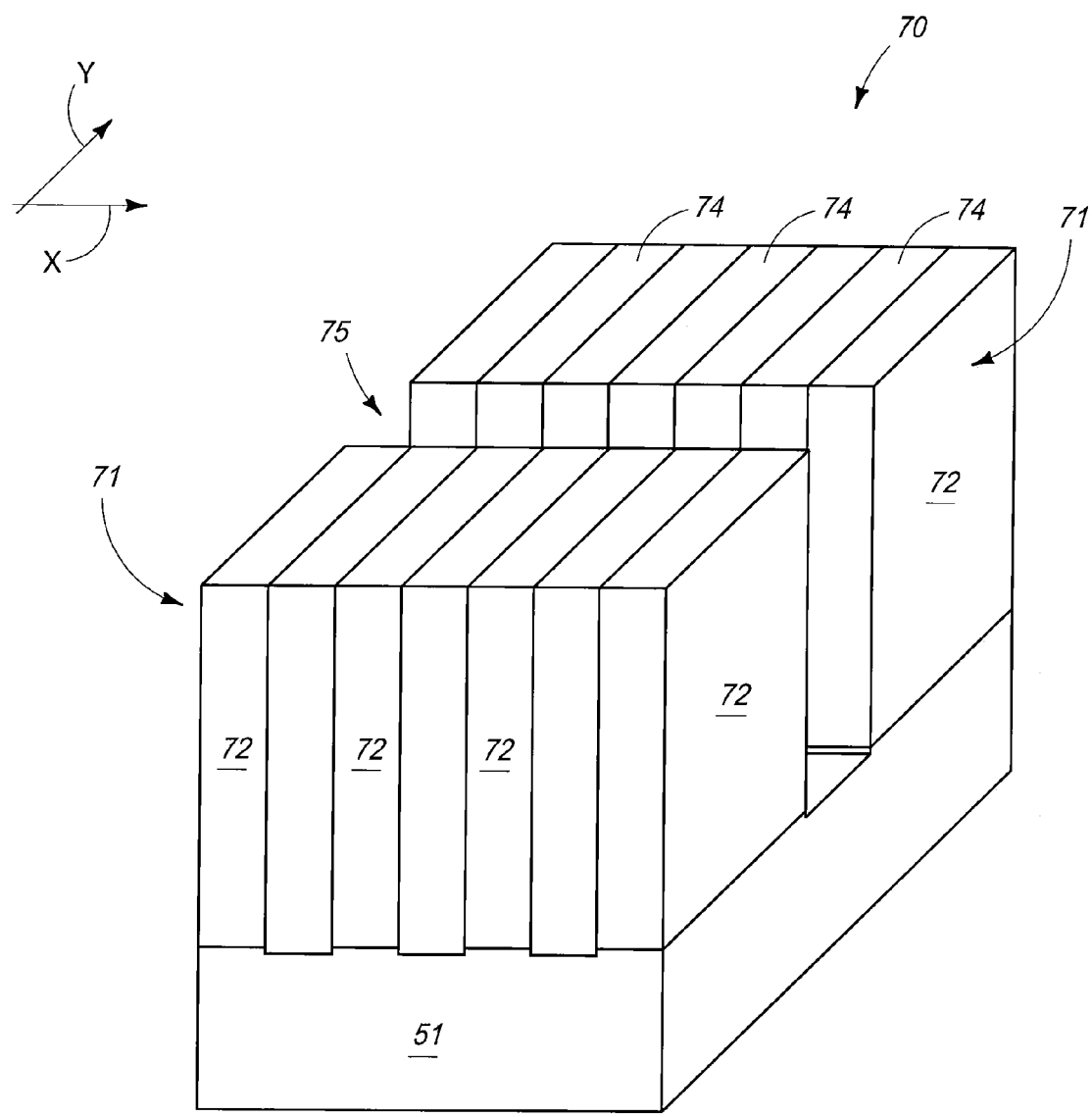
FIG. 10 is a view of the FIG. 9 substrate fragment at a processing step subsequent to that shown by FIG. 9.

Referring to FIG. 10, substrate 70 has been patterned orthogonally to the pattern depicted by FIG. 8, thereby forming blocks 71 of alternating semiconductor material and dielectric material having trenches 75 (only one being shown) formed between blocks 71.

Figure 11:
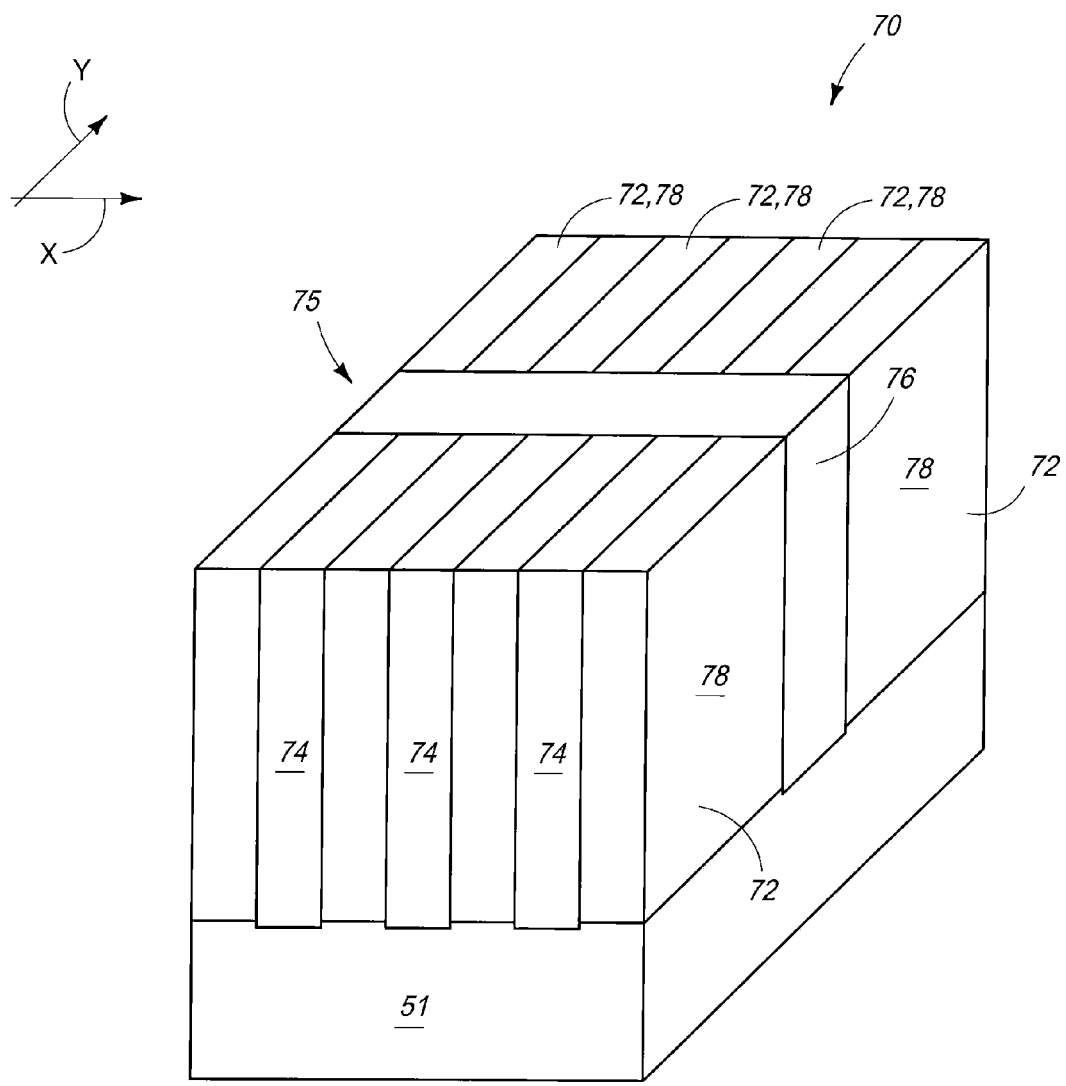
FIG. 11 is a view of the FIG. 10 substrate fragment at a processing step subsequent to that shown by FIG. 10.

Referring to FIG. 11, trench 75 has been filled with dielectric material 76. Examples include those described above with respect to dielectric material 74. In one embodiment, materials 74 and 76 may be of the same composition or at least be capable of being etched at substantially the same rate relative one another. Regardless, the processing through FIG. 11 depicts but one example of forming a block 78 of semiconductor material 72 over a substrate, with multiple such blocks 78 being shown.

Figure 12:
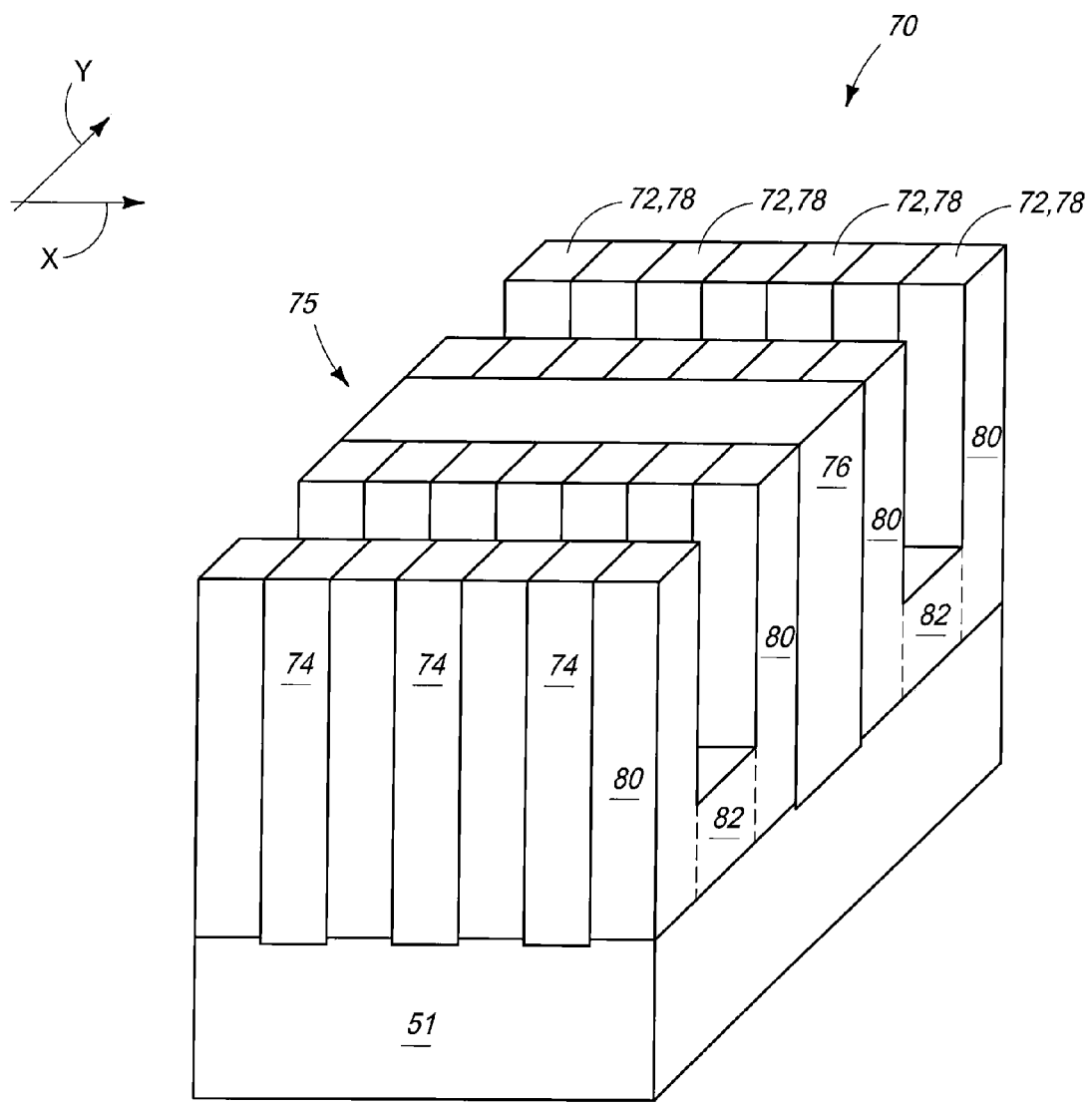
FIG. 12 is a view of the FIG. 11 substrate fragment at a processing step subsequent to that shown by FIG. 11.

Referring to FIG. 12, blocks 78 have been etched into to form an upwardly directed container shape (in the depicted embodiment a general U-shape) of semiconductor material 72 in lateral cross section with respect to individual blocks. In one embodiment where the container shape is of a general U-shape, such has a pair of vertical stems 80 having a base 82 extending laterally there-between in such lateral cross section. As an example, suitable masking material (not shown) may be provided over the outer surfaces of the structure of FIG. 12. Openings may be formed there-through which correspond in lateral and longitudinal dimensions to the trenches formed in FIG. 12, for example by etching, to produce the depicted cross-sectional upwardly directed container shape. Etching may be conducted, for example, to leave a thickness of base 82 of from about 20 nanometers to 50 nanometers. Materials 72 and 74 may be etched simultaneously and/or sequentially.

Figure 13:
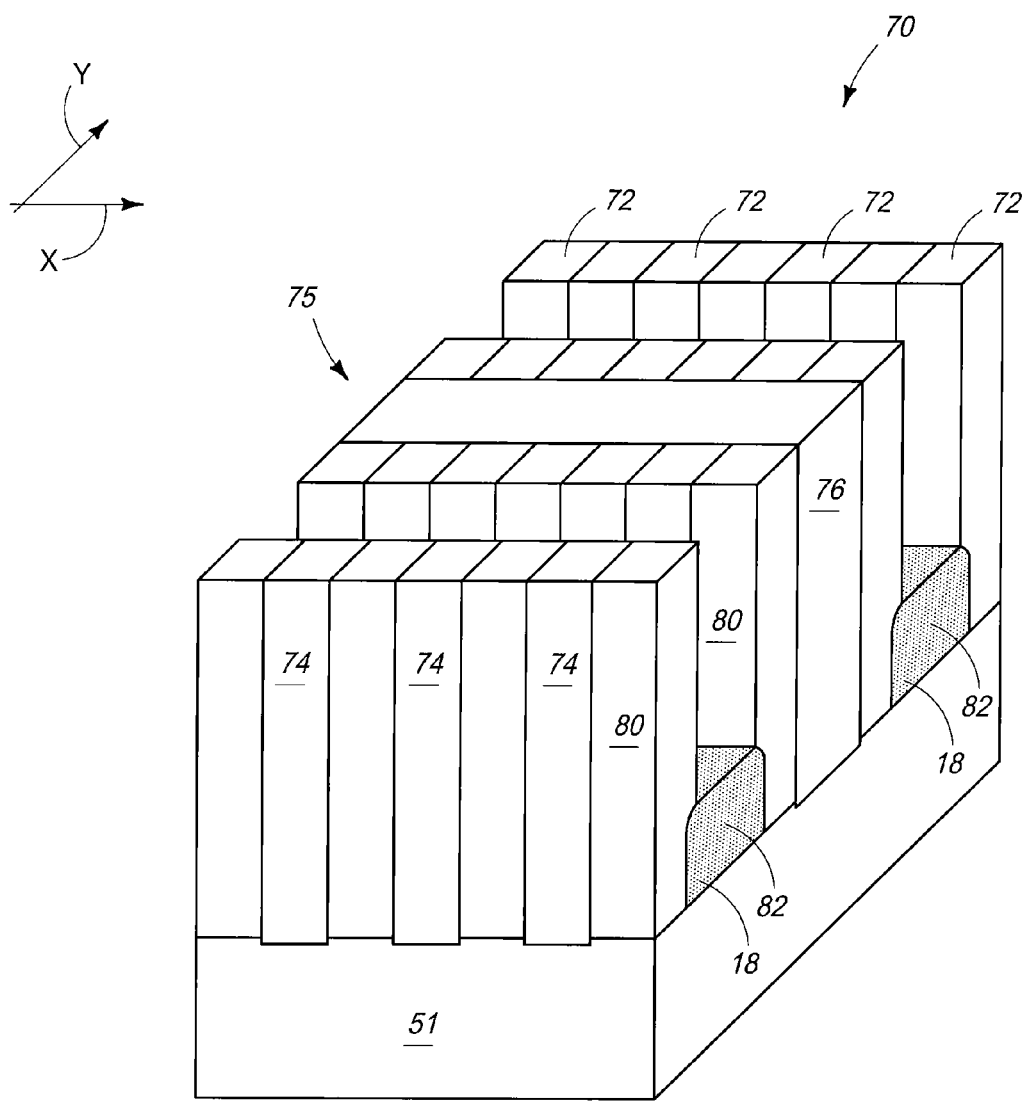
FIG. 13 is a view of the FIG. 12 substrate fragment at a processing step subsequent to that shown by FIG. 12.

Referring to FIG. 13, base 82 between stems 80 has been ion implanted with a conductivity modifying impurity of a first type to a first impurity concentration, for example to comprise region 18. The depicted laterally inner facing sidewalls within the container shape and the elevationally outer surfaces of the FIG. 13 structure may be masked (not shown) during such ion implanting. During or after such ion implanting, the conductivity modifying impurity may spread laterally, for example as shown. In one embodiment, the first type is n, with example dopant implant species being phosphorous and/or arsenic. Alternately, the first type may be p, with an example dopant implant species being boron.

Figure 14:
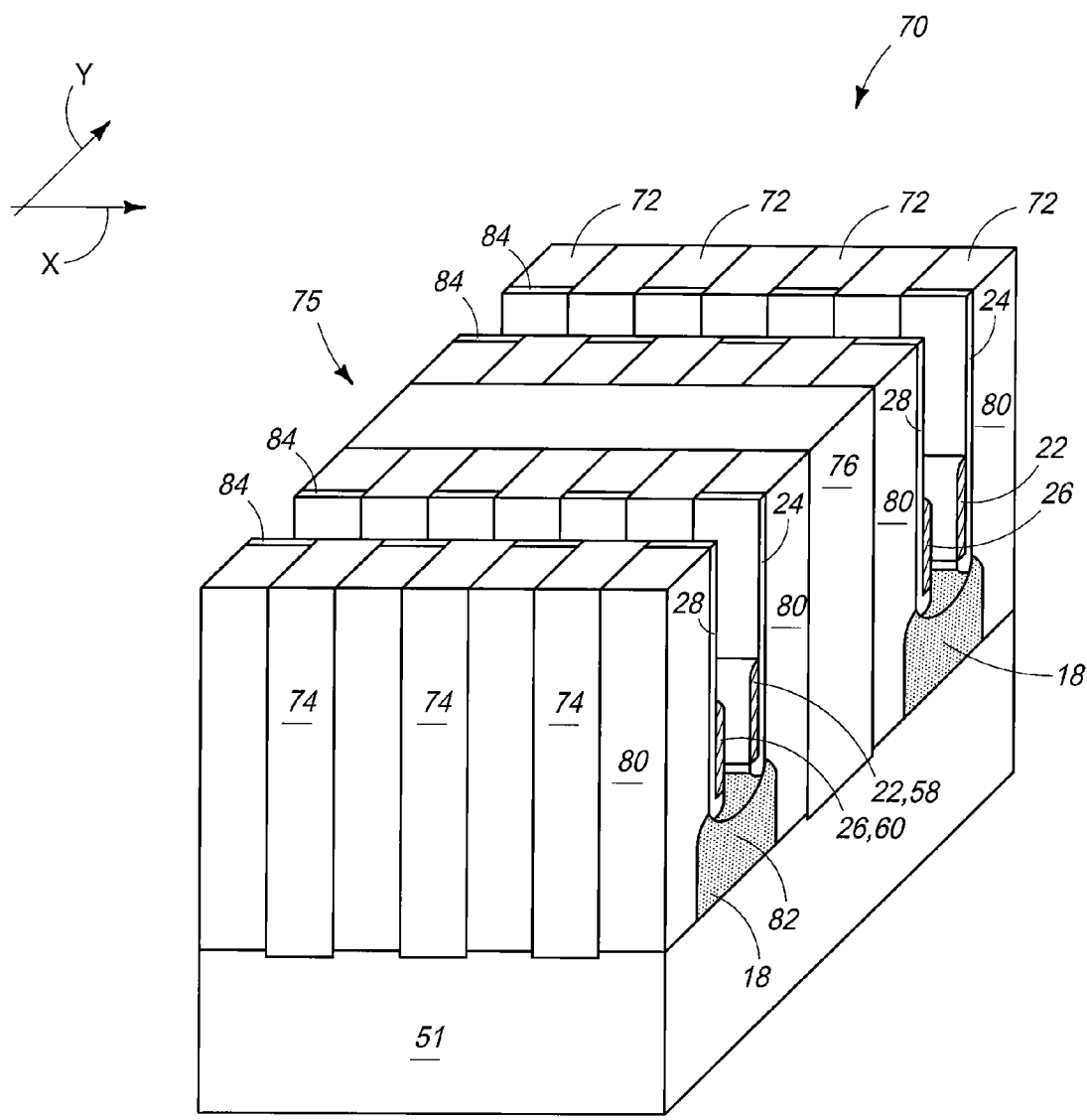
FIG. 14 is a view of the FIG. 13 substrate fragment at a processing step subsequent to that shown by FIG. 13.

Referring to FIG. 14, gate dielectric 24, 28 has been deposited over inner facing sidewalls of at least semiconductor material 72. Such may be of the same composition or of different compositions. The gate dielectric may be formed by one or both of depositing a layer over the substrate, or as another example and as shown by thermally oxidizing the exposed surfaces of semiconductor material 72 including for example the uppermost surface of the depicted region 18. Subsequently, a current conductive material may be deposited to line the depicted openings, and subsequently subjected to an anisotropic spacer etch to form control gate lines 26/60 and access gate lines 22/58. Thus, a control gate is provided operatively laterally adjacent an intermediate portion of one stem 80, and an access gate of an access transistor is provided operatively laterally adjacent an intermediate portion of the other stem 80. Gate dielectric 24, 28 may be exposed and etched through between gate lines 26/60 and 22/58. Further as shown, semiconductor material 72 of region 18 there-beneath may be etched elevationally inwardly and/or undercut laterally.

Figure 15:
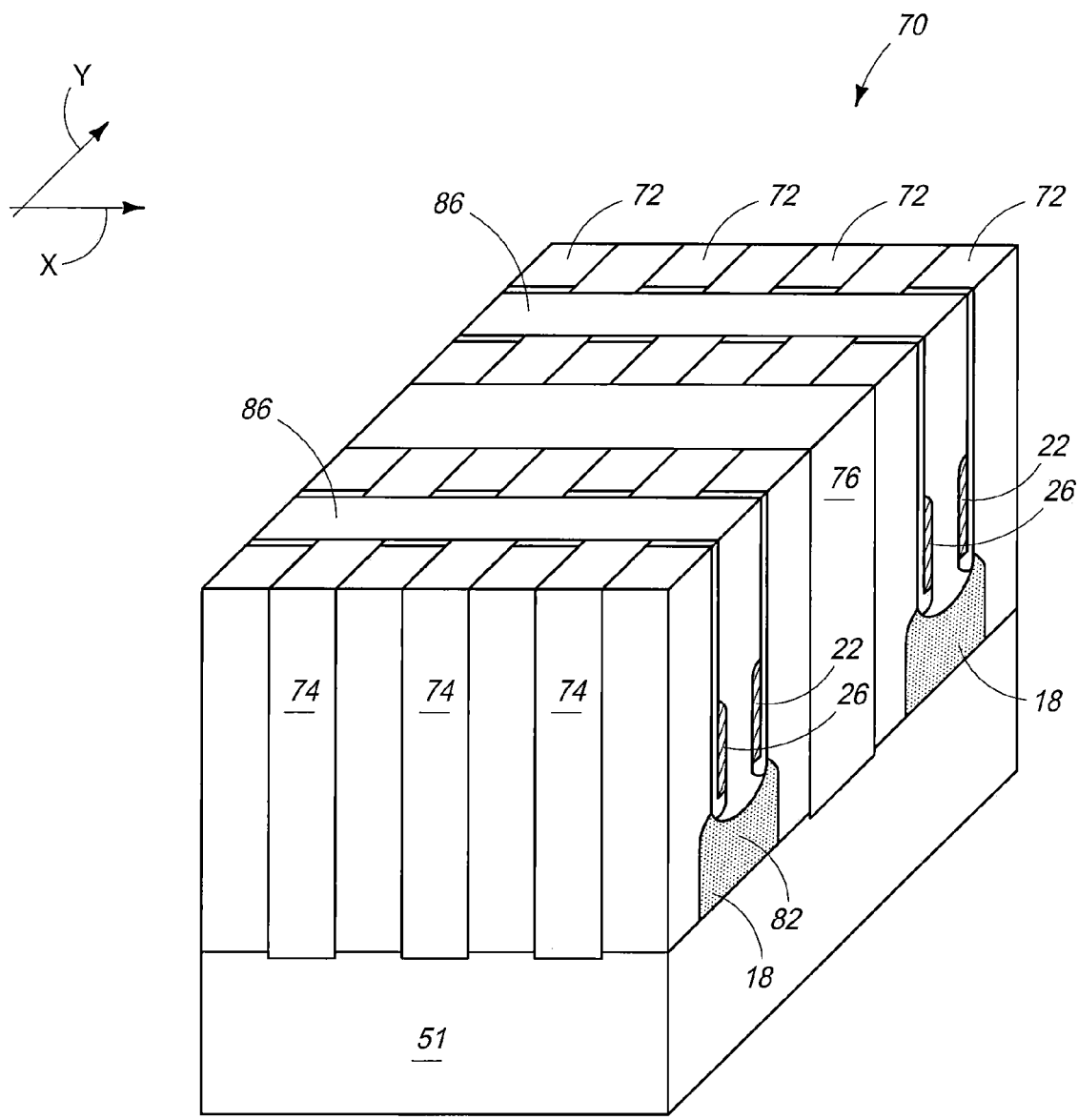
FIG. 15 is a view of the FIG. 14 substrate fragment at a processing step subsequent to that shown by FIG. 14.

Referring to FIG. 15, dielectric 86 has been deposited to fill remaining center volume of the container shapes, and subsequently planarized back.

Figure 16:
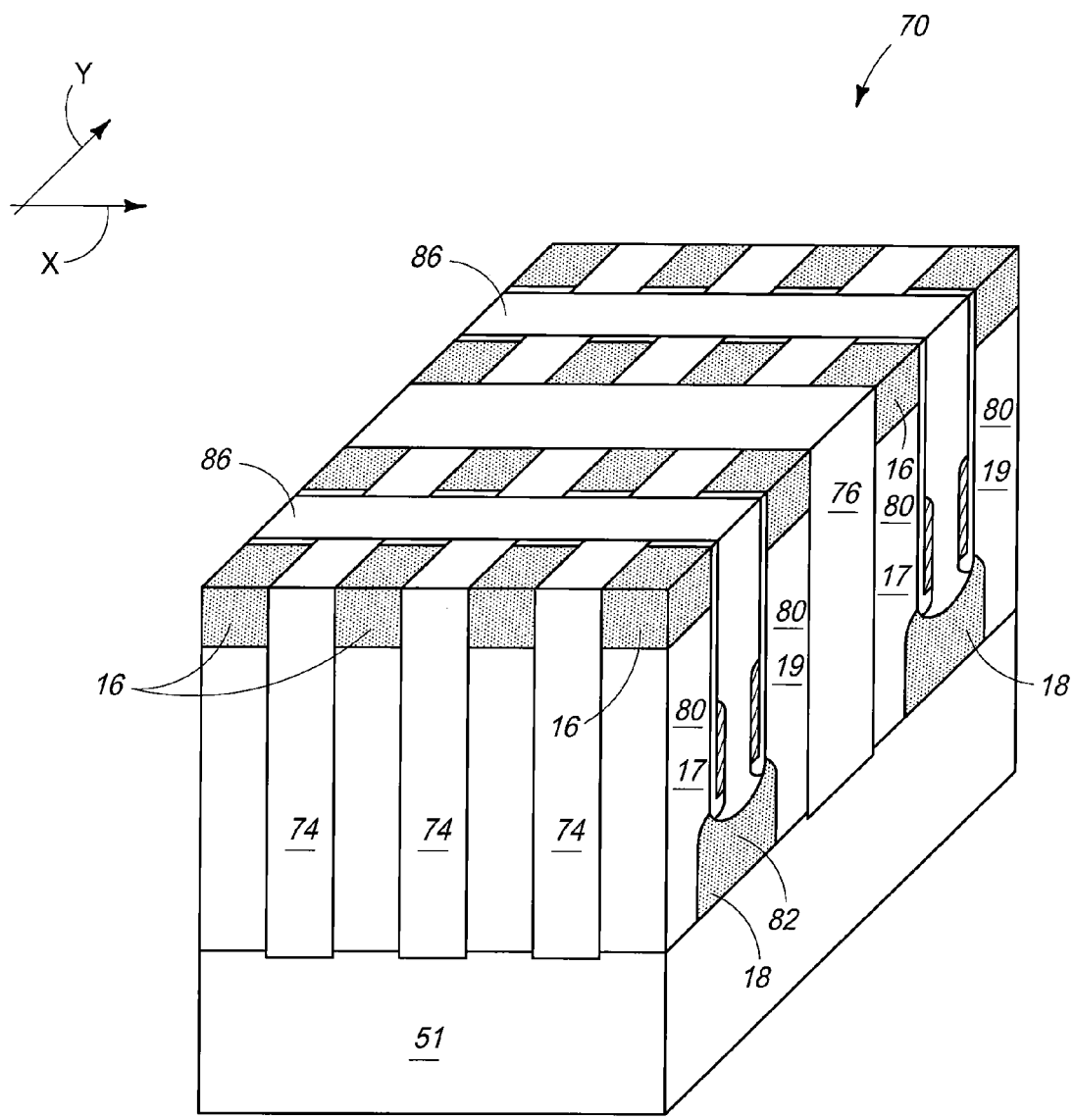
FIG. 16 is a view of the FIG. 15 substrate fragment at a processing step subsequent to that shown by FIG. 15.
Figure 17:
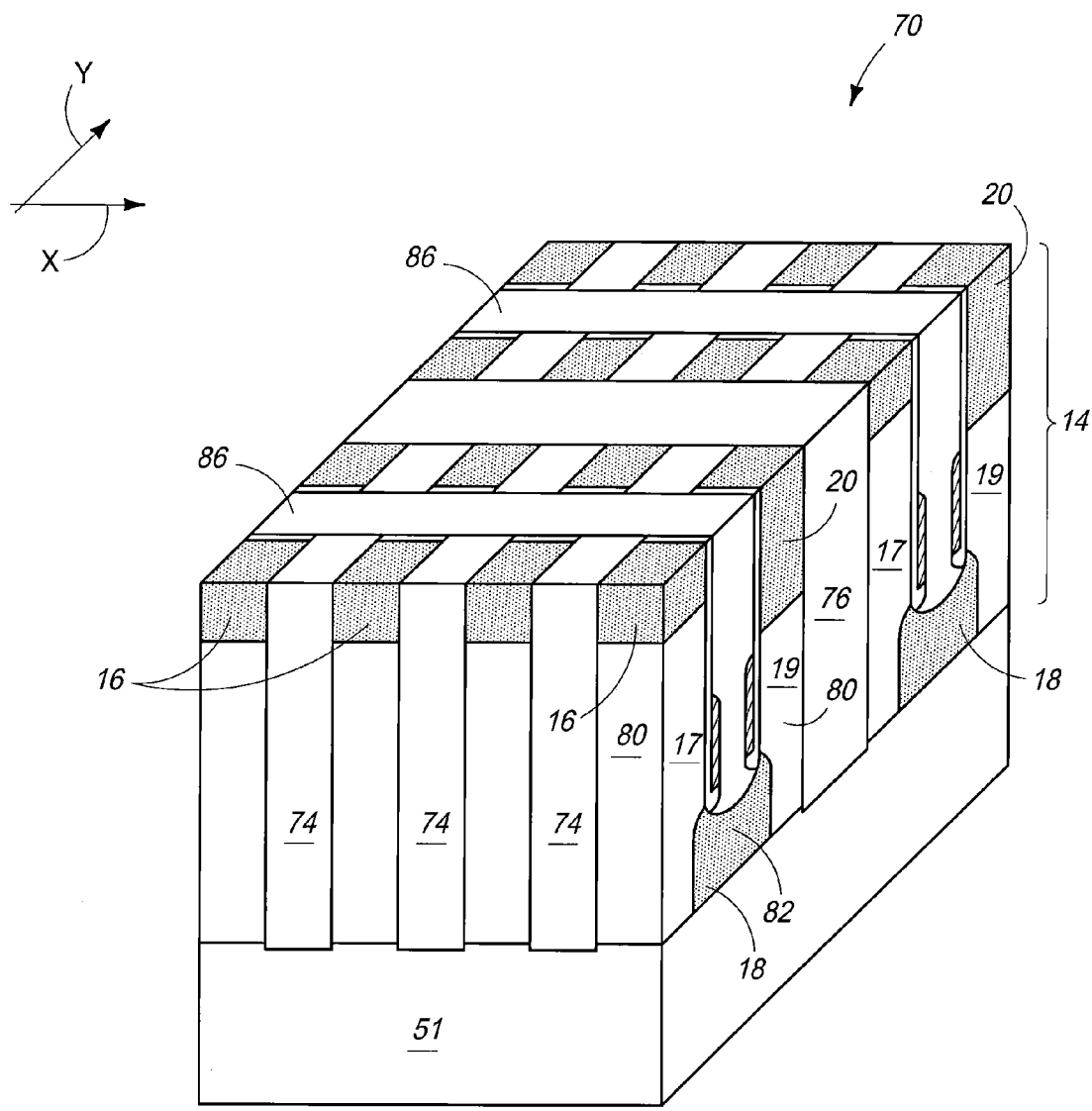
FIG. 17 is a view of the FIG. 16 substrate fragment at a processing step subsequent to that shown by FIG. 16.

Referring to FIG. 16, a suitable conductivity modifying impurity implant of the first type has been conducted into elevationally outermost portions of pair of stems 80, thereby forming example semiconductor regions 16. Referring to FIG. 17, at least such regions 16 have been masked and an implant of the first type conducted into the respective opposing stems to form semiconductor regions 20 of access transistors 14. Accordingly, elevationally outermost portions of one of the pair of stems 80 (namely the left-illustrated of such pairs of stems) is provided at a second impurity concentration of the first type (regions 16) that is lower than the first type impurity concentration within region 18.

Intermediate portions of stems 80 between elevationally outermost portions 16, 20 and base 82/18 are doped with a conductivity modifying impurity of a second type different from the first type and to a third impurity concentration, for example to form semiconductor regions 17 and 19. In one embodiment and as an example, semiconductive material 72 of blocks 78 (FIG. 11) may be provided in FIG. 11 and before to be entirely doped with conductivity modifying impurity of the second type to the third impurity concentration. Regions 16, 18 and 20 may be provided at other impurity concentrations of the second type by the processing described above with respect to FIGS. 15, 16 and 17. Regardless, regions 16 and/or 20 may be doped with their respective conductivity modifying impurity concentrations before or after the implanting to produce regions 18.

Figure 18:
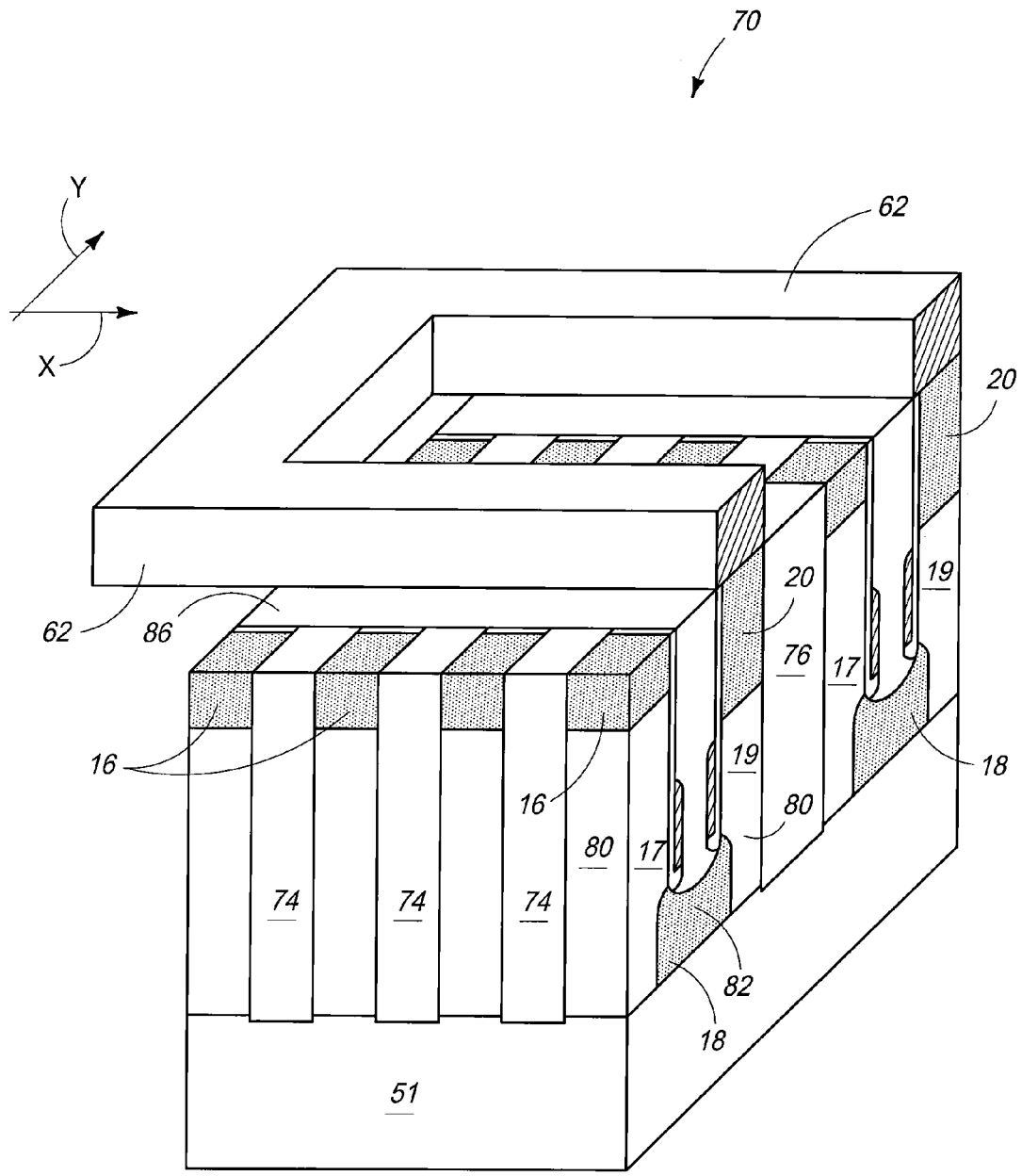
FIG. 18 is a view of the FIG. 17 substrate fragment at a processing step subsequent to that shown by FIG. 17.

Referring to FIG. 18, cathode lines 62 have been formed. Such may be provided by any suitable existing or yet-to-be-developed manner(s), with subtractive patterning and etch and/or damascene-like processing being examples. The respective cathode lines 62 may be hard-wired together as-shown.

Figure 19:
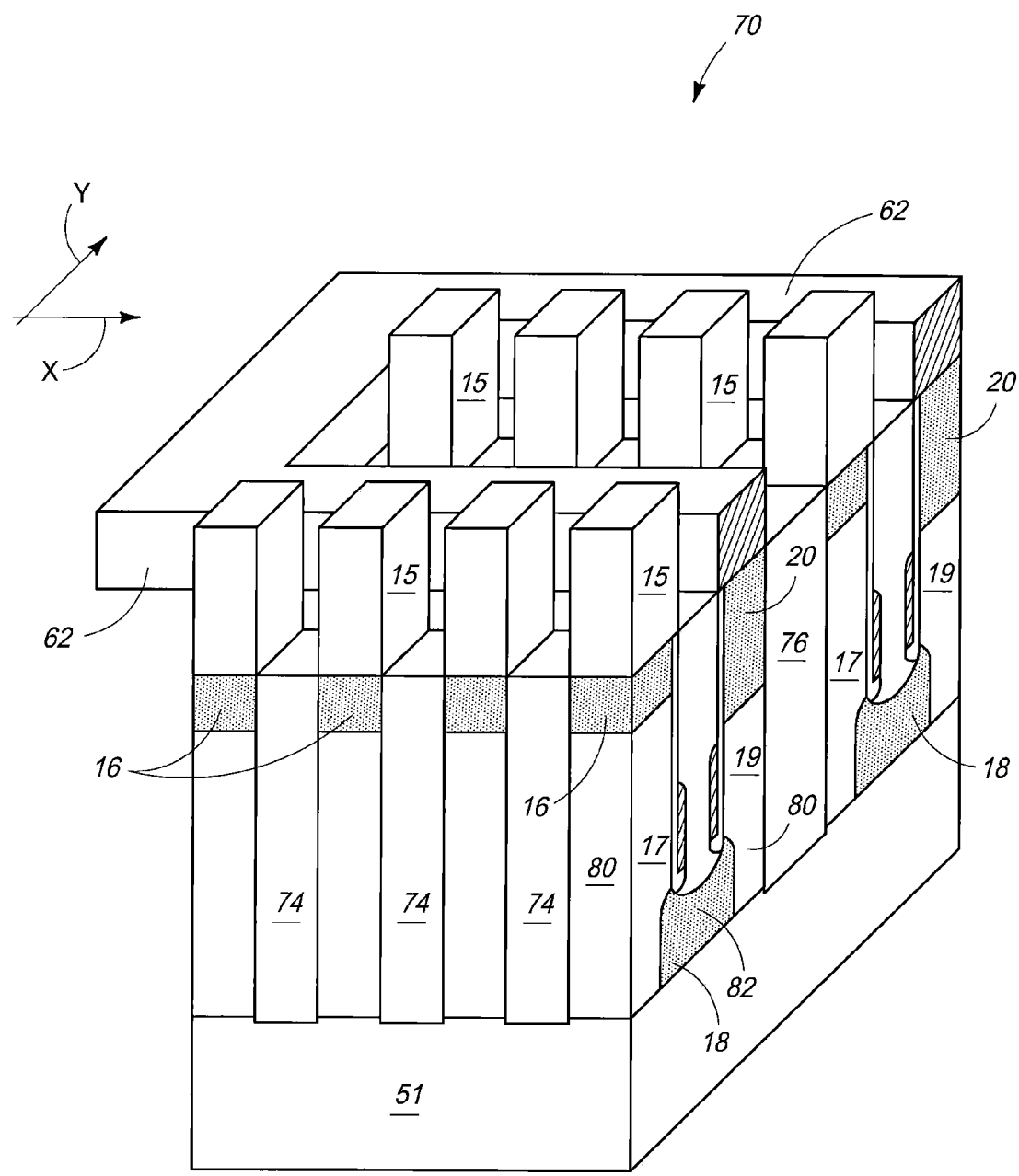
FIG. 19 is a view of the FIG. 18 substrate fragment at a processing step subsequent to that shown by FIG. 18.

Referring to FIG. 19, semiconductor material doped with a conductivity impurity of the second type to a fourth impurity concentration has been formed elevationally outward of and directly against elevationally outermost portion 16 of the left-illustrated stems, thereby forming semiconductor region 15. In this document, a material or structure is "directly against" another when there is at least some physical touching contact of the stated materials or structures relative one another. In contrast, "over" encompasses "directly against" as well as constructions where intervening material(s) or structure(s) result(s) in no physical touching contact of the stated materials or structures relative one another. The fourth impurity concentration is greater than the third impurity concentration. Semiconductor regions 15 may also be formed by any suitable existing or yet-to-be-developed manner(s), including for example epitaxial silicon growth. As another example, dielectric material could be deposited and contact openings subsequently etched there-through in the shape of regions 15. Such openings may be subsequently filled or provided with suitable semiconductor material doped with conductivity impurity of the second type to a desired fourth impurity concentration.

Figure 20:
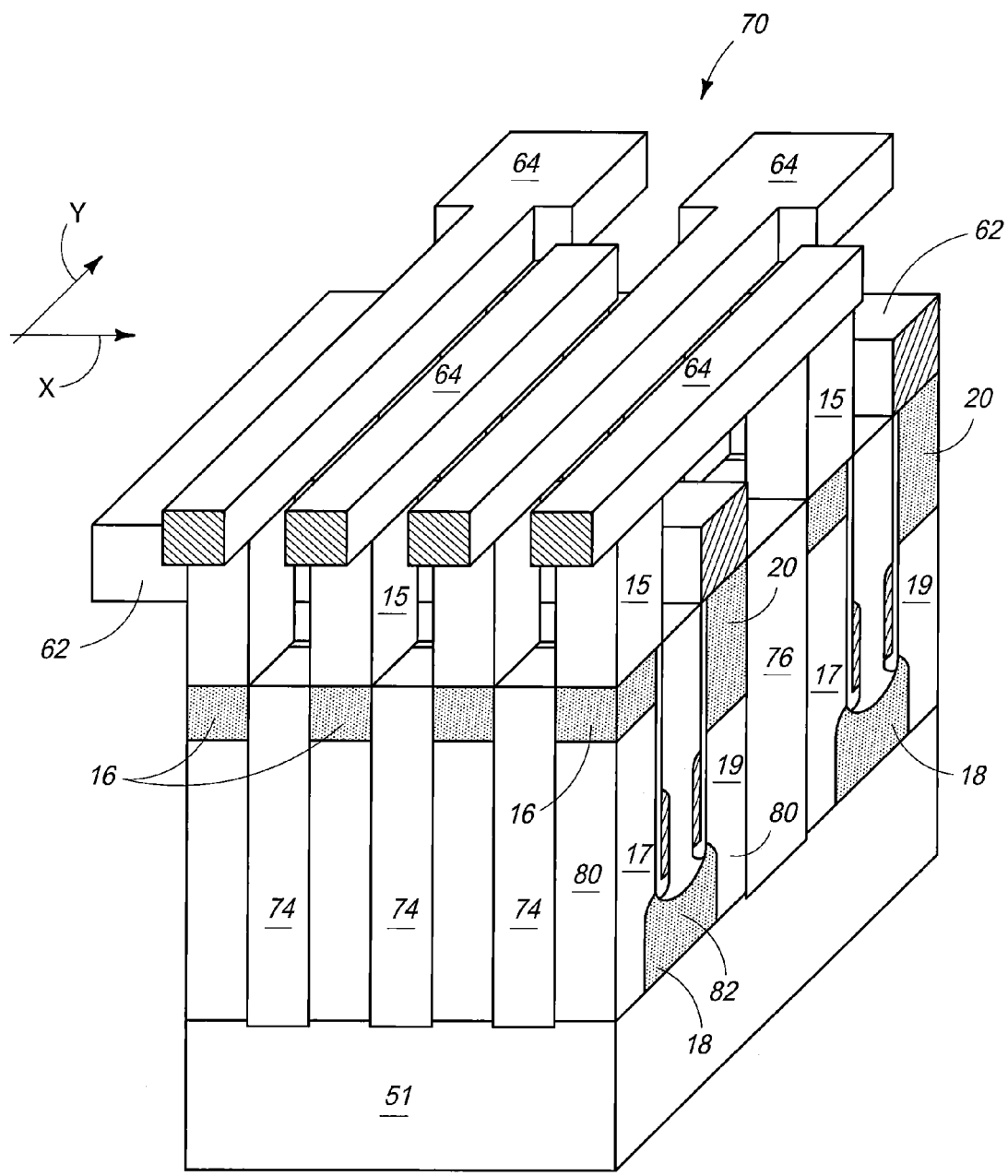
FIG. 20 is a view of the FIG. 19 substrate fragment at a processing step subsequent to that shown by FIG. 19.

Referring to FIG. 20, anode lines 64 may be formed in current conductive connection with semiconductor regions 15. Dielectric material elevationally outward of regions 16, 20 and material there-between is not shown in FIG. 20 for clarity in the drawing.

Figure 21:
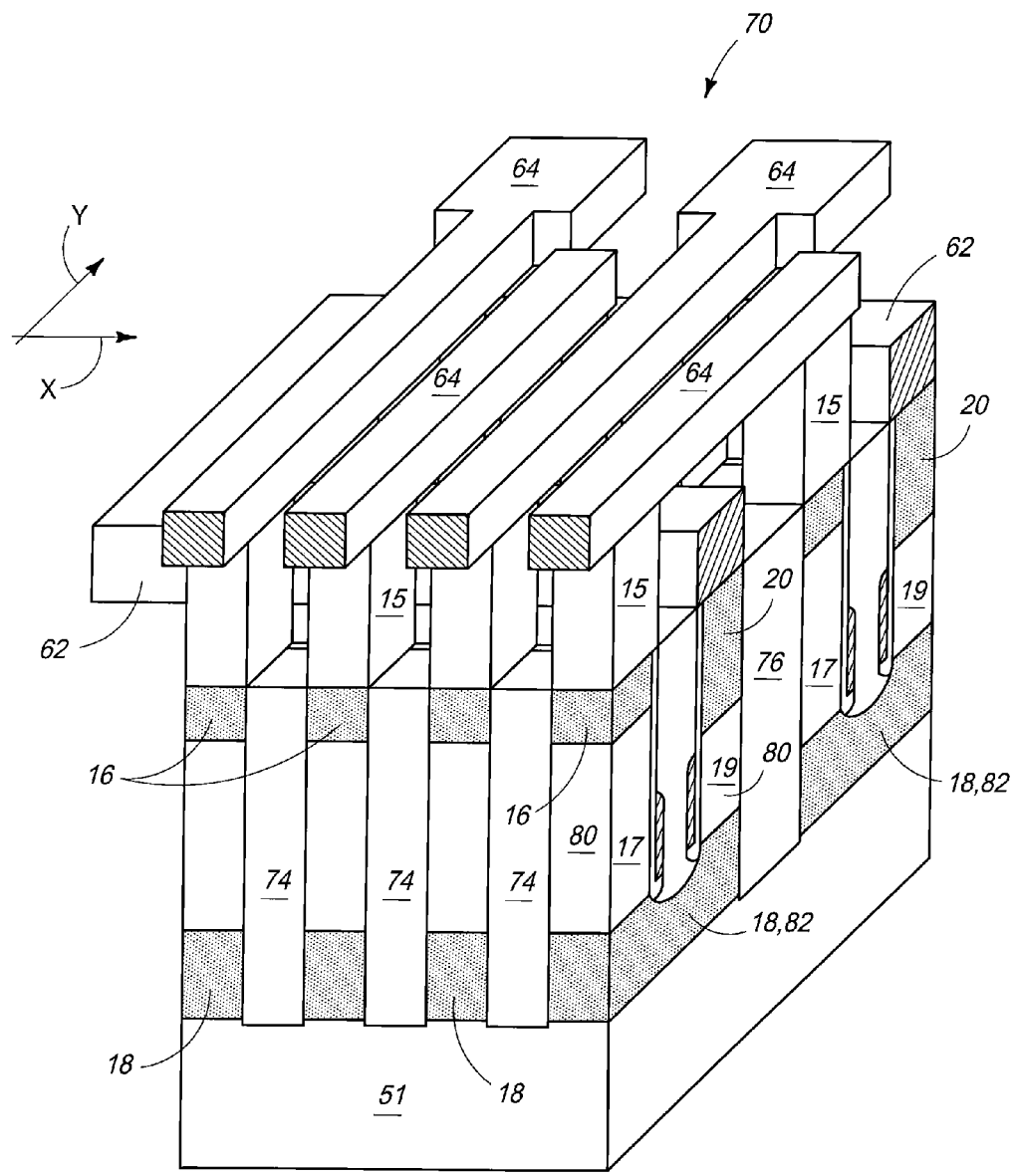
FIG. 21 is a view of the FIG. 20 substrate fragment at a processing step subsequent to that shown by FIG. 20.

Referring to FIG. 21, substrate 70 has been subjected to a suitable anneal to impart lateral diffusion of the dopant within shared region 18 laterally outward. In one embodiment and as shown, such diffusing is to laterally outermost surfaces of stems 80. The processing depicted by FIG. 21 may inherently occur with respect to the above processing associated with FIGS. 14-20 such that a dedicated annealing step may not be conducted. Alternately, no such laterally diffusion may occur such that the finished memory cell construction may have little or no lateral diffusion, for example as depicted in FIG. 14.

Processing may be alternately conducted to produce any of the memory cell or array constructions as described above with respect to FIGS. 3-7, for example to provide any of the control gates and/or access gates as shown and described above.

An embodiment of the invention includes a method of forming a shared doped semiconductor region of a vertically oriented thyristor and a vertically oriented access transistor. Such method comprises forming a general U-shape of semiconductor material in lateral cross section, with such shape having a pair of vertical stems and a base extending laterally there-between in such lateral cross section. The base is doped between the stems with a conductivity modifying impurity of at least one of n-type and p-type, with the shared doped semiconductor region being formed there-from. Such doping may be by ion implanting or other technique.

In one embodiment, the laterally inner facing sidewalls of the stems may be masked from such doping during such doping. In one embodiment, the shared doped semiconductor region may be annealed to diffuse the conductivity modifying impurity laterally outward into the stems, and in one embodiment to a degree to the laterally outermost surfaces of the stems. The above-described processing with respect to FIGS. 13-21 is but one example of such embodiments.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell, comprising:
   a thyristor comprising a plurality of alternately doped, vertically superposed semiconductor regions;
   a vertically oriented access transistor having an access gate, the thyristor being vertically taller than the access transistor; and
   a control gate operatively laterally adjacent one of the alternately doped, vertically superposed semiconductor regions; the control gate being spaced laterally of the access gate.

2. The memory cell of claim 1 wherein the access gate and the control gate elevationally overlap.

3. The memory cell of claim 2 wherein the access gate and the control gate are elevationally coincident.

4. The memory cell of claim 1 wherein the thyristor and the access transistor share a doped semiconductor region which extends laterally between the thyristor and the access transistor.

5. A memory cell, comprising:
   a plurality of alternately doped, superposed semiconductor regions at least an elevationally inner portion of which forms an upwardly directed container shape in lateral cross section, the semiconductor regions collectively comprising serially electrically connectable portions of a thyristor and an access transistor of the memory cell which share one of the doped semiconductor regions;
   an access gate operatively laterally adjacent an unshared of the semiconductor regions of the access transistor, the access gate being laterally within the upwardly directed container shape and not laterally outside of the upwardly directed container shape; and
   a control gate operatively laterally adjacent an unshared of the semiconductor regions of the thyristor.

6. A memory cell, comprising:
   a plurality of alternately doped, superposed semiconductor regions at least an elevationally inner portion of which forms an upwardly directed container shape in lateral cross section, the semiconductor regions collectively comprising serially electrically connectable portions of a thyristor and an access transistor of the memory cell which share one of the doped semiconductor regions;
   an access gate operatively laterally adjacent an unshared of the semiconductor regions of the access transistor, the access gate being laterally outside of the upwardly directed container shape and not laterally within the upwardly directed container shape; and
   a control gate operatively laterally adjacent an unshared of the semiconductor regions of the thyristor.

7. A memory cell, comprising:
   a plurality of alternately doped, superposed semiconductor regions at least an elevationally inner portion of which forms an upwardly directed container shape in lateral cross section, the semiconductor regions collectively comprising serially electrically connectable portions of a thyristor and an access transistor of the memory cell which share one of the doped semiconductor regions;
   an access gate operatively laterally adjacent an unshared of the semiconductor regions of the access transistor; and
   a control gate operatively laterally adjacent an unshared of the semiconductor regions of the thyristor, the control gate being laterally within the upwardly directed container shape and not laterally outside of the upwardly directed container shape.

8. A memory cell, comprising:
   a plurality of alternately doped, superposed semiconductor regions at least an elevationally inner portion of which forms an upwardly directed container shape in lateral cross section, the semiconductor regions collectively comprising serially electrically connectable portions of a thyristor and an access transistor of the memory cell which share one of the doped semiconductor regions;

an access gate operatively laterally adjacent an unshared of the semiconductor regions of the access transistor; and a control gate operatively laterally adjacent an unshared of the semiconductor regions of the thyristor, the control gate being laterally outside of the upwardly directed container shape and not laterally within the upwardly directed container shape.

9. A memory cell, comprising:

a plurality of alternately doped, superposed semiconductor regions at least an elevationally inner portion of which forms an upwardly directed container shape in lateral cross section, the semiconductor regions collectively comprising serially electrically connectable portions of a thyristor and an access transistor of the memory cell which share one of the doped semiconductor regions;

an access gate operatively laterally adjacent an unshared of the semiconductor regions of the access transistor; and a control gate operatively laterally adjacent an unshared of the semiconductor regions of the thyristor, the control gate and the access gate being laterally outside of the upwardly directed container shape and not laterally within the upwardly directed container shape.

10. A memory cell, comprising:

a plurality of alternately doped, superposed semiconductor regions at least an elevationally inner portion of which forms an upwardly directed container shape in lateral cross section, the semiconductor regions collectively comprising serially electrically connectable portions of a thyristor and an access transistor of the memory cell which share one of the doped semiconductor regions;

an access gate operatively laterally adjacent an unshared of the semiconductor regions of the access transistor;

a control gate operatively laterally adjacent an unshared of the semiconductor regions of the thyristor; and the upwardly directed container shape comprising a general U-shape having a pair of vertical stems having a base extending laterally there-between in the lateral cross section, one of the stems being taller than the other.

11. A memory array, comprising:

a horizontal array of memory cells comprising:

a plurality of thyristors substantially aligned in a plurality of rows in a first direction and in a plurality of columns in a second direction angled relative to the first direction; individual of the thyristors comprising a plurality of alternately doped, vertically superposed semiconductor regions;

a plurality of vertically oriented access transistors substantially aligned in a plurality of rows in the first direction and in a plurality of columns in the second direction, individual of the access transistors having an access gate which comprises a portion of individual conductive access gate lines oriented in a plurality of rows in the first direction;

a control gate operatively laterally adjacent one of the plurality of vertically superposed, alternately doped semiconductor regions of individual of the plurality of thyristors; individual of the control gates comprising a portion of individual conductive control gate lines oriented in a plurality of rows in the first direction;

a plurality of cathode lines substantially aligned in a plurality of rows in the first direction elevationally outward of the access gate lines;

a plurality of anode lines substantially aligned in a plurality of columns in the second direction elevationally outward of the control gate lines; and individual of the vertically oriented access transistors comprising a respective channel region having a pair of laterally opposing sides, the access gate of individual of the vertically oriented access transistors being operatively laterally adjacent only one of the pair of laterally opposing sides of the respective channel region.

12. A memory array, comprising:

a horizontal array of memory cells comprising:

a plurality of thyristors substantially aligned in a plurality of rows in a first direction and in a plurality of columns in a second direction angled relative to the first direction; individual of the thyristors comprising a plurality of alternately doped, vertically superposed semiconductor regions;

a plurality of vertically oriented access transistors substantially aligned in a plurality of rows in the first direction and in a plurality of columns in the second direction, individual of the access transistors having an access gate which comprises a portion of individual conductive access gate lines oriented in a plurality of rows in the first direction;

a control gate operatively laterally adjacent one of the plurality of vertically superposed, alternately doped semiconductor regions of individual of the plurality of thyristors; individual of the control gates comprising a portion of individual conductive control gate lines oriented in a plurality of rows in the first direction;

a plurality of cathode lines substantially aligned in a plurality of rows in the first direction elevationally outward of the access gate lines;

a plurality of anode lines substantially aligned in a plurality of columns in the second direction elevationally outward of the control gate lines;

the access gate lines are spaced laterally of the control gate lines; and individual of the one of the plurality of vertically superposed, alternately doped semiconductor regions of individual thyristors having a pair of laterally opposing sides; individual of the control gates being operatively laterally adjacent only one of the pair of laterally opposing sides.

13. A memory array, comprising:

a horizontal array of memory cells comprising:

a plurality of thyristors substantially aligned in a plurality of rows in a first direction and in a plurality of columns in a second direction angled relative to the first direction; individual of the thyristors comprising a plurality of alternately doped, vertically superposed semiconductor regions;

a plurality of vertically oriented access transistors substantially aligned in a plurality of rows in the first direction and in a plurality of columns in the second direction, individual of the access transistors having an access gate which comprises a portion of individual conductive access gate lines oriented in a plurality of rows in the first direction;

a control gate operatively laterally adjacent one of the plurality of vertically superposed, alternately doped semiconductor regions of individual of the plurality of thyristors; individual of the control gates comprising a portion of individual conductive control gate lines oriented in a plurality of rows in the first direction;

a plurality of cathode lines substantially aligned in a plurality of rows in the first direction elevationally outward of the access gate lines;
a plurality of anode lines substantially aligned in a plurality of columns in the second direction elevationally outward of the control gate lines; and
the thyristors being vertically taller than the access transistors.

14. A memory array, comprising:
a horizontal array of memory cells comprising:
a plurality of thyristors substantially aligned in a plurality of rows in a first direction and in a plurality of columns in a second direction angled relative to the first direction; individual of the thyristors comprising a plurality of alternately doped, vertically superposed semiconductor regions;
a plurality of vertically oriented access transistors substantially aligned in a plurality of rows in the first direction and in a plurality of columns in the second direction, individual of the access transistors having an access gate which comprises a portion of individual conductive access gate lines oriented in a plurality of rows in the first direction;
a control gate operatively laterally adjacent one of the plurality of vertically superposed, alternately doped semiconductor regions of individual of the plurality of thyristors; individual of the control gates comprising a portion of individual conductive control gate lines oriented in a plurality of rows in the first direction;
a plurality of cathode lines substantially aligned in a plurality of rows in the first direction elevationally outward of the access gate lines;
a plurality of anode lines substantially aligned in a plurality of columns in the second direction elevationally outward of the control gate lines; and
the anode lines being elevationally outward of the cathode lines.

15. A memory array, comprising:
a horizontal array of memory cells comprising:
a plurality of thyristors substantially aligned in a plurality of rows in a first direction and in a plurality of columns in a second direction angled relative to the first direction; individual of the thyristors comprising a plurality of alternately doped, vertically superposed semiconductor regions;
a plurality of vertically oriented access transistors substantially aligned in a plurality of rows in the first direction and in a plurality of columns in the second direction, individual of the access transistors having an access gate which comprises a portion of individual conductive access gate lines oriented in a plurality of rows in the first direction;
a control gate operatively laterally adjacent one of the plurality of vertically superposed, alternately doped semiconductor regions of individual of the plurality of thyristors; individual of the control gates comprising a portion of individual conductive control gate lines oriented in a plurality of rows in the first direction;
a plurality of cathode lines substantially aligned in a plurality of rows in the first direction elevationally outward of the access gate lines;
a plurality of anode lines substantially aligned in a plurality of columns in the second direction elevationally outward of the control gate lines; and
the cathode lines being elevationally outward of the anode lines.

16. A memory cell, comprising:
a thyristor comprising a plurality of alternately doped, vertically superposed semiconductor regions, one of the semiconductor regions comprising a channel region;
a vertically oriented access transistor having an access gate and a channel region, the channel region of the thyristor being vertically taller than the channel region of the access transistor; and
a control gate operatively laterally adjacent the channel region of the thyristor; the control gate being spaced laterally of the access gate.

17. The memory cell of claim 16 wherein the thyristor is vertically taller than the access transistor.

* * * * *